US012796230B2

(12) United States Patent
Lee et al.

(10) Patent No.: US 12,796,230 B2
(45) Date of Patent: Nov. 10, 2026

(54) DISPLAY PANEL

(71) Applicant: Samsung Display Co., LTD., Yongin-si (KR)

(72) Inventors: Jeongseok Lee, Yongin-si (KR); Woo Yong Sung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 451 days.

(21) Appl. No.: 18/454,387

(22) Filed: Aug. 23, 2023

(65) Prior Publication Data

US 2024/0138198 A1 Apr. 25, 2024
US 2024/0237417 A9 Jul. 11, 2024

(30) Foreign Application Priority Data

Oct. 24, 2022 (KR) ........................ 10-2022-0137590

(51) Int. Cl.
*H10K 59/122* (2023.01)
*H10K 59/121* (2023.01)
*H10K 59/80* (2023.01)
*H10K 59/88* (2023.01)

(52) U.S. Cl.
CPC ......... *H10K 59/122* (2023.02); *H10K 59/121* (2023.02); *H10K 59/80515* (2023.02); *H10K 59/88* (2023.02)

(58) Field of Classification Search
CPC ........... H10K 59/122; H10K 59/80515; H10K 59/88; H10K 59/121
USPC .......................................................... 313/500
See application file for complete search history.

(56) References Cited

U.S. PATENT DOCUMENTS 6,137,220 A * 10/2000 Nagayama ........... H10K 59/173 313/506
10,236,474 B2 3/2019 Song
10,263,053 B2 4/2019 Beak et al.
10,978,672 B2 4/2021 Lee et al.
11,342,404 B2 5/2022 Ko et al.
(Continued)

FOREIGN PATENT DOCUMENTS

KR 10-2006-0094214 A 8/2006
KR 10-2009-0068505 6/2009
(Continued)

OTHER PUBLICATIONS

K-PION Patent File Wrapper Search (Year: 2026).*

*Primary Examiner* — James R Greece
*Assistant Examiner* — Hana S Featherly
(74) *Attorney, Agent, or Firm* — Womble Bond Dickinson (US) LLP

(57) ABSTRACT

Provided is a display panel including a bank layer including a first pixel opening and a second pixel opening, a first light-emitting element disposed in the first pixel opening, and including a first anode, a first organic layer, and a first cathode contacting the bank layer, a second light-emitting element disposed in the second pixel opening, and including a second anode, a second organic layer, and a second cathode spaced apart from the first cathode and contacting the bank layer, and a barrier layer disposed between the bank layer and the first anode, and exposing at least a part of the first anode. The first anode is spaced apart from the bank layer with the barrier layer disposed the first anode and the bank layer on a cross-section.

19 Claims, 32 Drawing Sheets

(56) References Cited

U.S. PATENT DOCUMENTS

| | | | | |
|---|---|---|---|---|
| 11,348,983 | B1 | 5/2022 | Choung et al. | |
| 11,417,860 | B2 | 8/2022 | Lee et al. | |
| 11,610,954 | B1 * | 3/2023 | Lin | H10K 59/122 |
| 2011/0233572 | A1 | 9/2011 | Nakatani et al. | |
| 2014/0103385 | A1 * | 4/2014 | Hatano | H10H 20/857<br>438/28 |
| 2016/0013438 | A1 | 1/2016 | Im et al. | |
| 2020/0006701 | A1 * | 1/2020 | Lee | H10K 59/12 |
| 2020/0243790 | A1 | 7/2020 | Lee et al. | |
| 2020/0312930 | A1 * | 10/2020 | Choi | H10K 50/19 |
| 2021/0027705 | A1 * | 1/2021 | Huang | G09G 3/3225 |

FOREIGN PATENT DOCUMENTS

| | | |
|---|---|---|
| KR | 10-1502206 | 3/2015 |
| KR | 10-2016-0055670 | 5/2016 |
| KR | 10-2020-0003336 | 1/2020 |
| KR | 10-2020-0051150 A | 5/2020 |
| KR | 10-2021-0022206 | 3/2021 |

* cited by examiner

DISPLAY PANEL

CROSS-REFERENCE TO RELATED APPLICATIONS

This application claims priority to and benefits of Korean Patent Application No. 10-2022-0137590 under 35 U.S.C. § 119, filed on Oct. 24, 2022 in the Korean Intellectual Property Office, the entire contents of which are incorporated herein by reference.

BACKGROUND

1. Technical Field

The disclosure herein relates to a display panel, and, to an organic light-emitting display panel.

2. Description of the Related Art

A display device is activated in response to an electrical signal. A display device may include a panel which displays an image. Among display panels, an organic light-emitting display panel has low power consumption, high brightness, and a high response speed.

Among display panels, an organic light-emitting display panel may include an anode, a cathode, and a light-emitting layer. A light-emitting layer is separately provided for each light-emitting region, and a cathode applies a common voltage to each light-emitting region.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display panel including an organic light-emitting element formed without using a metal mask.

The technical objectives to be achieved by the disclosure are not limited to those described herein, and other technical objectives that are not mentioned herein would be clearly understood by a person skilled in the art from the description of the disclosure.

An embodiment provides a display panel that may include a bank layer including a first pixel opening and a second pixel opening; a first light-emitting element disposed in the first pixel opening, and including a first anode, a first organic layer, and a first cathode, the first cathode contacting the bank layer; a second light-emitting element disposed in the second pixel opening, and including a second anode, a second organic layer, and a second cathode, the second cathode spaced apart from the first cathode and contacting the bank layer; and a barrier layer disposed between the bank layer and the first anode, and exposing at least a part of the first anode, wherein, the first anode is spaced apart from the bank layer with the barrier layer disposed between the first anode and the bank layer on a cross-section.

In an embodiment, the barrier layer may include a transparent conductive oxide.

In an embodiment, a first surface of the bank layer defining the first pixel opening may protrude from an inner surface of the barrier layer, exposing the first anode, to define a tip part.

In an embodiment, the bank layer may include a first bank layer including an inorganic material, and contacting the barrier layer, and a second bank layer disposed on the first bank layer, and including a conductive material, wherein the second cathode may contact the second bank layer.

In an embodiment, the first pixel opening and the second pixel opening may each have a substantially undercut shape on a cross-section, and the second bank layer may have side surfaces defining the substantially undercut shape.

In an embodiment, the second bank layer may include a first layer having a conductive material and having a first inner surface defining the first pixel opening, and a second layer disposed on the first layer and having a second inner surface defining the first pixel opening, wherein the second inner surface may protrude from the first inner surface.

In an embodiment, the second bank layer may further include a third layer disposed between the second layer and the first bank layer, and having a third inner surface protruding from the first inner surface to define the first pixel opening.

In an embodiment, the height of a part in which the first cathode and the first inner surface are in contact may be substantially equal to or greater than about 2000 Å, on a cross-section.

In an embodiment, a thickness of a part in which the first cathode and the first inner surface are in contact may be substantially equal to or greater than about 30 Å.

In an embodiment, the bank layer may further include a groove defined between the first pixel opening and the second pixel opening.

In an embodiment, the groove may penetrate the second bank layer.

In an embodiment, the groove may have a depth greater than a thickness of the bank layer.

In an embodiment, the groove may be recessed from an upper surface of the second bank layer, and a depth of the groove may be less than a thickness of the second bank layer.

In an embodiment, the display panel may further include an inorganic film covering the first light-emitting element and the second light-emitting element, and having a substantially integrated shape.

In an embodiment, the display panel may further include at least one deposition layer disposed on the bank layer, wherein the first organic layer and the second organic layer, and the first cathode and the second cathode may be separated from the deposition layer, and the deposition layer may be covered by the inorganic film.

In an embodiment, a display panel may include a bank layer including a first pixel opening, a second pixel opening, and a groove disposed between the first pixel opening and the second pixel opening, and which has a conductive material; a first light-emitting element disposed in the first pixel opening, and including a first anode, a first organic layer, and a first cathode, a second light-emitting element disposed in the second pixel opening, and including a second anode, a second organic layer, and a second cathode, and a dummy layer disposed in the groove, having a same material as the first organic layer or the first cathode, and separated from the first organic layer and the first cathode, wherein the first cathode and the second cathode are spaced apart from each other, and in contact with the bank layer.

In an embodiment, the groove may have a substantially mesh shape in a plan view.

In an embodiment, a depth of the groove may be less than a thickness of the bank layer.

In an embodiment, the groove may include groove patterns separated from each other in a plan view.

In an embodiment, a depth of the groove may be substantially equal to or greater than a thickness of the bank layer.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
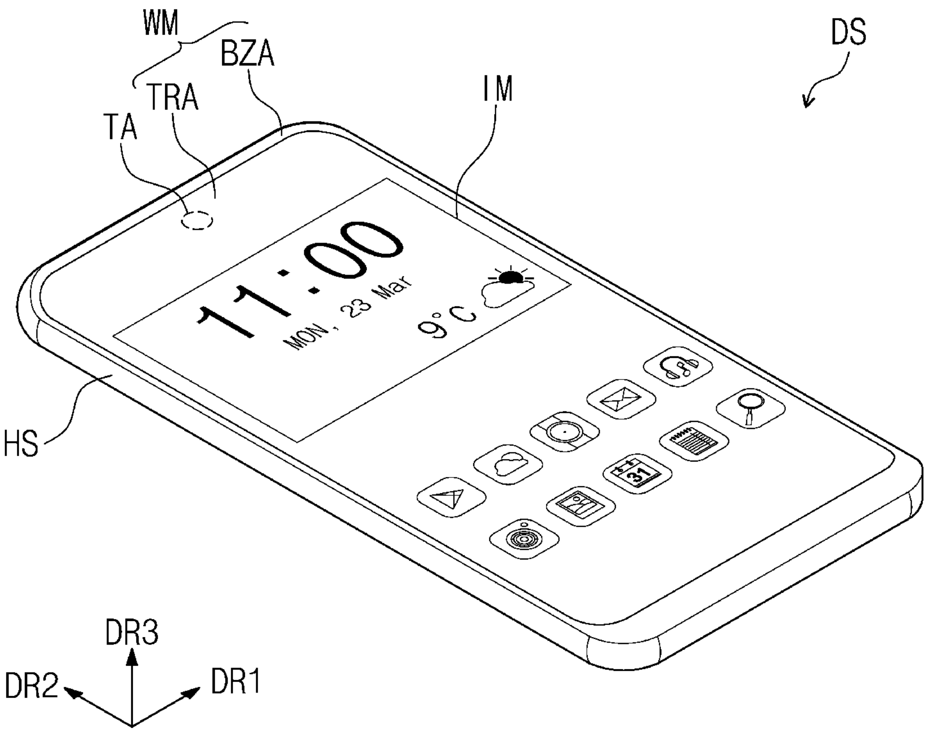
FIG. 1 is a combined perspective view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this specification, when a component (or region, layer, portion, etc.) is referred to as "on", "connected", or "coupled" to another component, it means that it is placed/connected/coupled directly on the other component or a third component or other component can be disposed between them.

The same reference numerals or symbols refer to the same elements. In the drawings, thicknesses, ratios, and dimensions of components are exaggerated for effective description of technical content.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Terms such as first and second may be used to describe various components, but the components should not be limited by the terms. These terms are only used for the purpose of distinguishing one component from other components. For example, without departing from the scope of the disclosure, a first component may be referred to as a second component, and similarly, a second component may be referred to as a first component. Singular expressions include plural expressions unless the context clearly indicates otherwise.

Terms such as "below", "lower", "above", and "upper" are used to describe the relationship between components shown in the drawings. The terms are relative concepts and are described based on the directions indicated in the drawings.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

Unless otherwise defined, or implied all terms (including technical and scientific terms) used in this specification have the same meaning as commonly understood by one of ordinary skill in the art to which this disclosure belongs. Terms such as terms defined in commonly used dictionaries should be interpreted as having a meaning consistent with the meaning having in the context of the related technology, and should not be interpreted as too ideal or too formal unless explicitly defined here.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Hereinafter, embodiments will be described with reference to the drawings.

Figure 2:
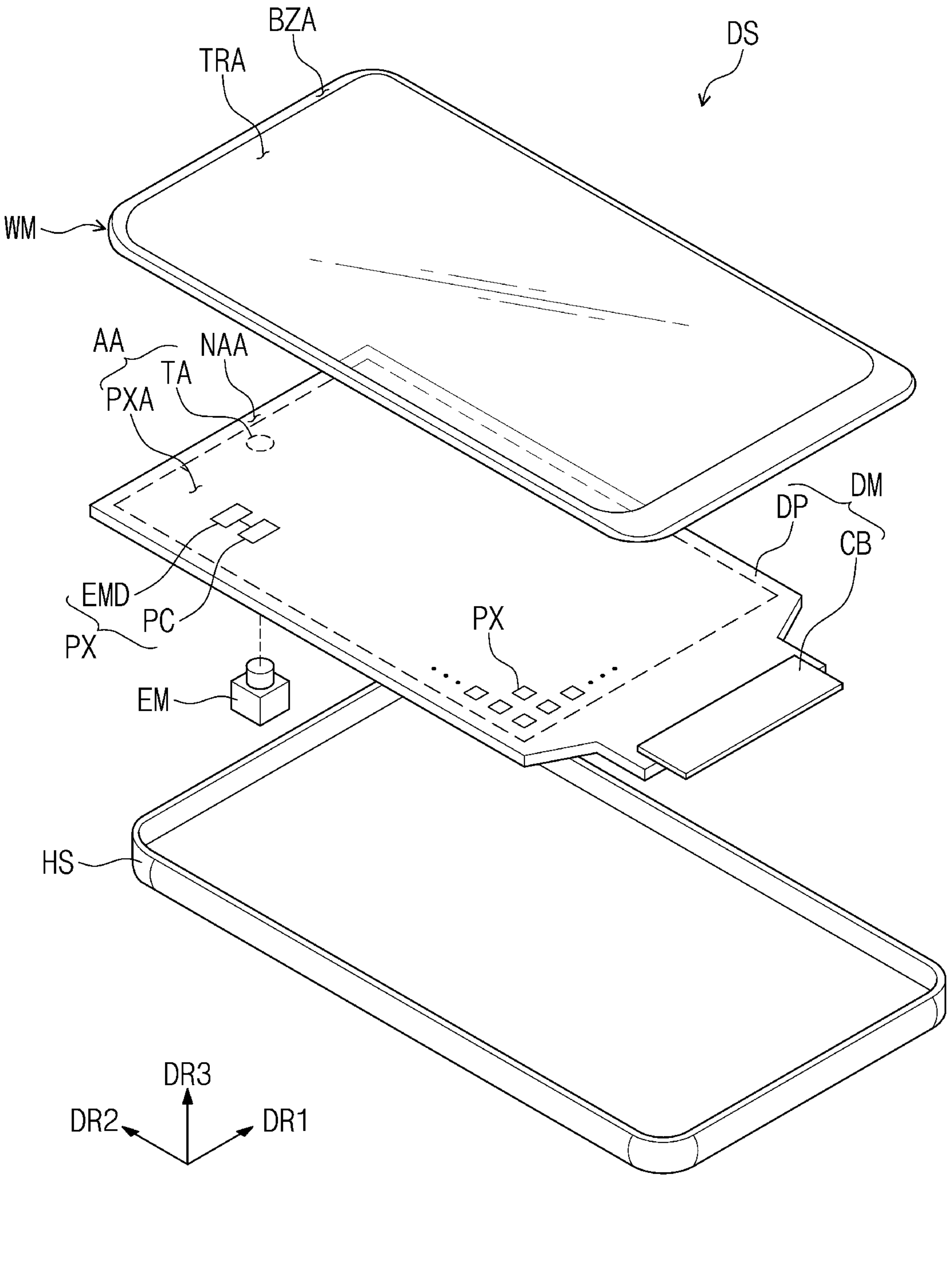
FIG. 2 is an exploded perspective view of a display device illustrated in FIG. 1.

FIG. 1 is a combined perspective view of a display device according to an embodiment. FIG. 2 is an exploded perspective view of the display device illustrated in FIG. 1. Hereinafter, the disclosure will be described with reference to FIGS. 1 and 2.

A display device DS may display an image IM. For example, the display device DS may include a tablet computer, a laptop computer, a computer, a smartphone, a television, etc. In an embodiment, a smartphone is illustrated as an example of the display device DS.

A user receives information through the image IM displayed in an active region AA. The image IM may include at least any one of a static image or a dynamic image. FIG. 1 illustrates a clock and icons as an example of the image IM.

The display device DS may include a window WM, a display module DM, an electronic module EM, and a housing unit HS. The window WM is coupled or connected to the housing unit HS to form the exterior of the display device DS.

The window WM may include an optically transparent insulating material. For example, the window WM may include glass or plastic. The window WM may have a single- or multi-layered structure. For example, the window WM may have a stack structure of plastic films bonded with an adhesive, or a stack structure of a glass substrate and a plastic film bonded with an adhesive.

The window WM may include a transparent region TRA and a bezel region BZA. The transparent region TRA may be optically transparent. The image IM generated by the display module DM may be viewed from the outside of the display device DS through the transparent region TRA.

The transparent region TRA may have a shape corresponding to the active region AA to be described later. The transparent region TRA may have a quadrilateral shape parallel to each of a first direction DR1 and a second direction DR2. However, this is illustrated as an example, the transparent region TRA may have various shapes, and an embodiment is not limited thereto.

The bezel region BZA is adjacent to the transparent region TRA. The bezel region BZA may have a transmittance relatively lower than the transparent region TRA. In case that the window WM is provided as a glass or plastic substrate, the bezel region BZA may be a color layer printed or deposited on one surface or a surface of the glass or plastic substrate. By way of example, the bezel region BZA may be formed by coloring the corresponding region of the glass or plastic substrate.

The bezel region BZA defines a shape of a transmission region TA. The bezel region BZA may be adjacent to the transparent region TRA, and may surround the transparent region TRA. However, this is illustrated as an example, and the bezel region BZA may be disposed adjacent to only one side or a side of the transparent region TRA, or may be omitted.

A direction DR3 (hereinafter, a third direction) perpendicular to the transparent region TRA may correspond to a thickness direction of the display device DS. The image IM is displayed in the third direction DR3. In an embodiment, the front surface (or upper surface) and the rear surface (lower surface) of each member are defined with respect to a direction in which the image IM is displayed. The front surface and the rear surface are opposed to each other in the third direction DR3.

Directions indicated by the first to third directions DR1, DR2, and DR3 are relative concepts, and may be changed to other directions. Hereinafter, the first to third directions are denoted as the same reference numerals or symbols for directions respectively indicated by the first to third directions DR1, DR2, and DR3.

The display module DM is disposed between the window WM and the housing unit HS. The display module DM may be accommodated in a space formed by coupling or connecting the window WM and the housing unit HS. The display module DM may include a display panel DP and a circuit board CB.

The front surface of the display panel DP may include an active region AA and a peripheral region NAA. Pixels PX may be disposed in the active region AA. The pixels PX generate the image IM.

The active region AA may include a light-emitting region PXA and the transmission region TA. Light-emitting pixels among the pixels PX may be disposed in the light-emitting region PXA, and the image IM is displayed through light generated by the light-emitting pixels. Detailed description thereof will be made later.

The transmission region TA may have a transmittance relatively higher than the light-emitting region PXA. Transmission pixels among the pixels PX may be disposed in the transmission region TA. Relatively fewer light-emitting pixels may be disposed in the transmission region TA than in the light-emitting region PXA. For example, a density of light-emitting pixels disposed in the transmission region TA is smaller than a density of light-emitting pixels disposed in the light-emitting region PXA. By way of example, the light-emitting pixels may not be disposed in the transmission region TA.

The transmission region TA is defined adjacent to the light-emitting region PXA. In an embodiment, the entire transmission region TA is defined as being surrounded by the light-emitting region PXA. However, this is illustrated as an example, the transmission region TA may be partially defined in a position adjacent to the light-emitting region PXA, and may be provided in various shapes other than a circular shape, and an embodiment is not limited thereto.

The peripheral region NAA is adjacent to the active region AA. The pixels PX may not be disposed in the peripheral region NAA. Driving circuits for driving the pixels PX may also be disposed in the peripheral region NAA.

The circuit board CB is connected to the display panel DP. It is illustrated that the circuit board CB is coupled or connected to the display panel DP in the peripheral region NAA. The circuit board CB is electrically connected to the display panel DP. Various electronic elements for driving the pixels PX may be mounted on the circuit board CB. This is illustrated as an example, various electronic elements for driving the pixels PX may be mounted on the display panel DP, and at this time, the circuit board CB may be omitted. The display device DS according to an embodiment may include various embodiments, and is not limited to any one embodiment.

The electronic module EM is disposed between the window WM and the housing unit HS. The electronic module EM may be accommodated in a space formed by coupling or connecting the window WM and the housing unit HS. The electronic module EM is disposed overlapping the display panel DP on a plane.

The electronic module EM overlaps the active region AA of the display panel DP on a plane, and also overlaps the transparent region TRA of the window WM on a plane. The electronic module EM is disposed overlapping the transmission region TA of the active region AA.

The electronic module EM may include an image-capturing module such as a camera, a light-receiving module such as an infrared detector, a sound module such as a speaker, a module such as an ultrasonic detector, etc. In an embodiment, the electronic module EM may capture an image of a subject existing outside the display device DS through the transmission region TA, or may receive an external input, for example, a touch or light, provided to the transparent region TRA. Since the electronic module EM is disposed overlapping the display panel DP, expansion of the bezel region BZA may be prevented, and thus a narrow bezel display device or a borderless display device may be provided. This is illustrated as an example, the electronic module EM may be disposed overlapping the peripheral region NAA, or not overlapping the display panel DP, and an embodiment is not limited thereto.

According to the disclosure, the display device DS is illustrated as a device having a flat rigid form, but may be foldable. At this time, the display device DS may be folded or unfolded with respect to a folding axis overlapping at least a part of the active region AA, and the display panel DP may be flexibly provided. As long as being capable of displaying an image, the display device DS according to an embodiment may be provided in various forms, and is not limited to any one embodiment.

Figure 3A:
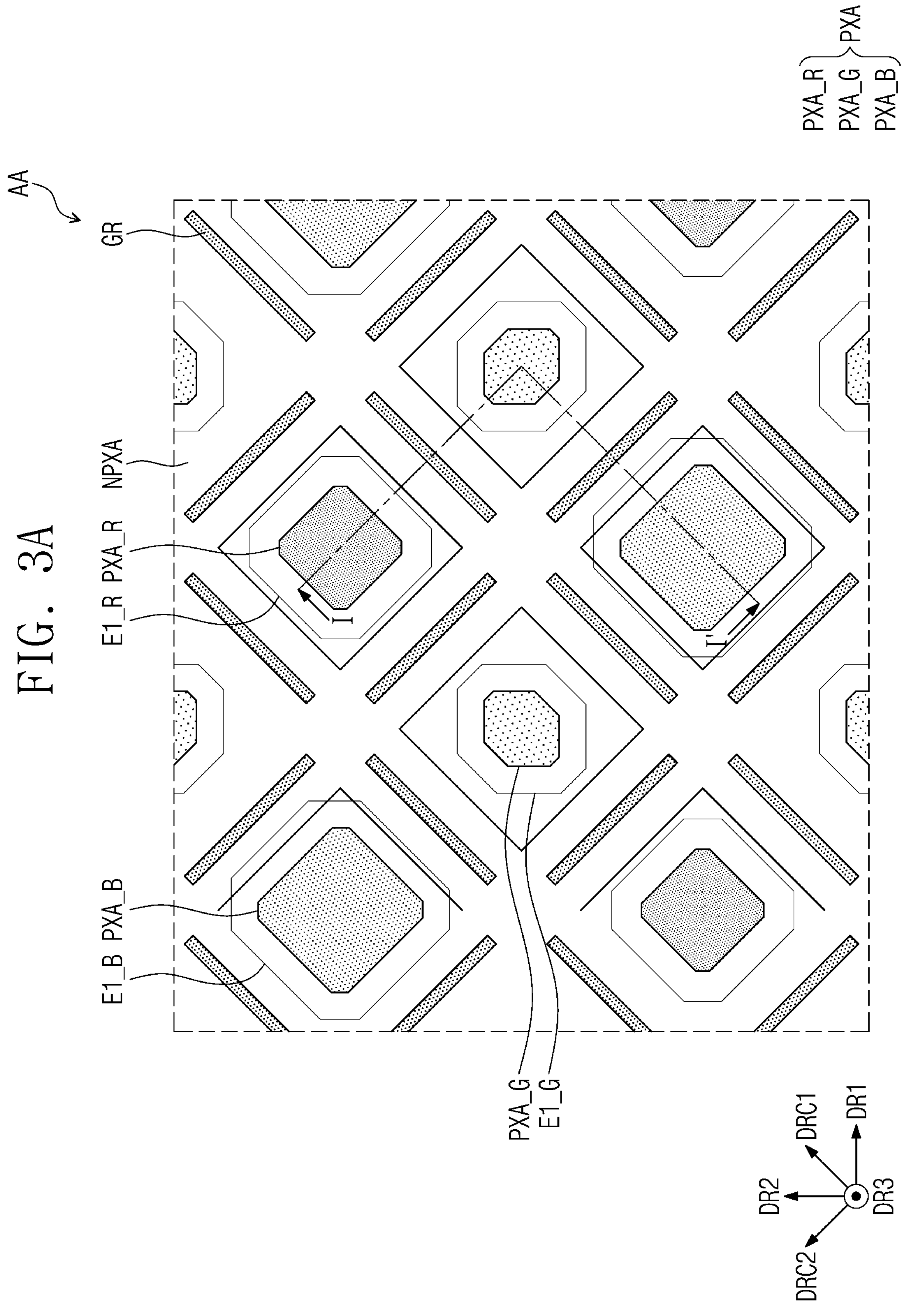
FIG. 3A is a schematic plan view illustrating a part of a display panel according to an embodiment.
Figure 3B:
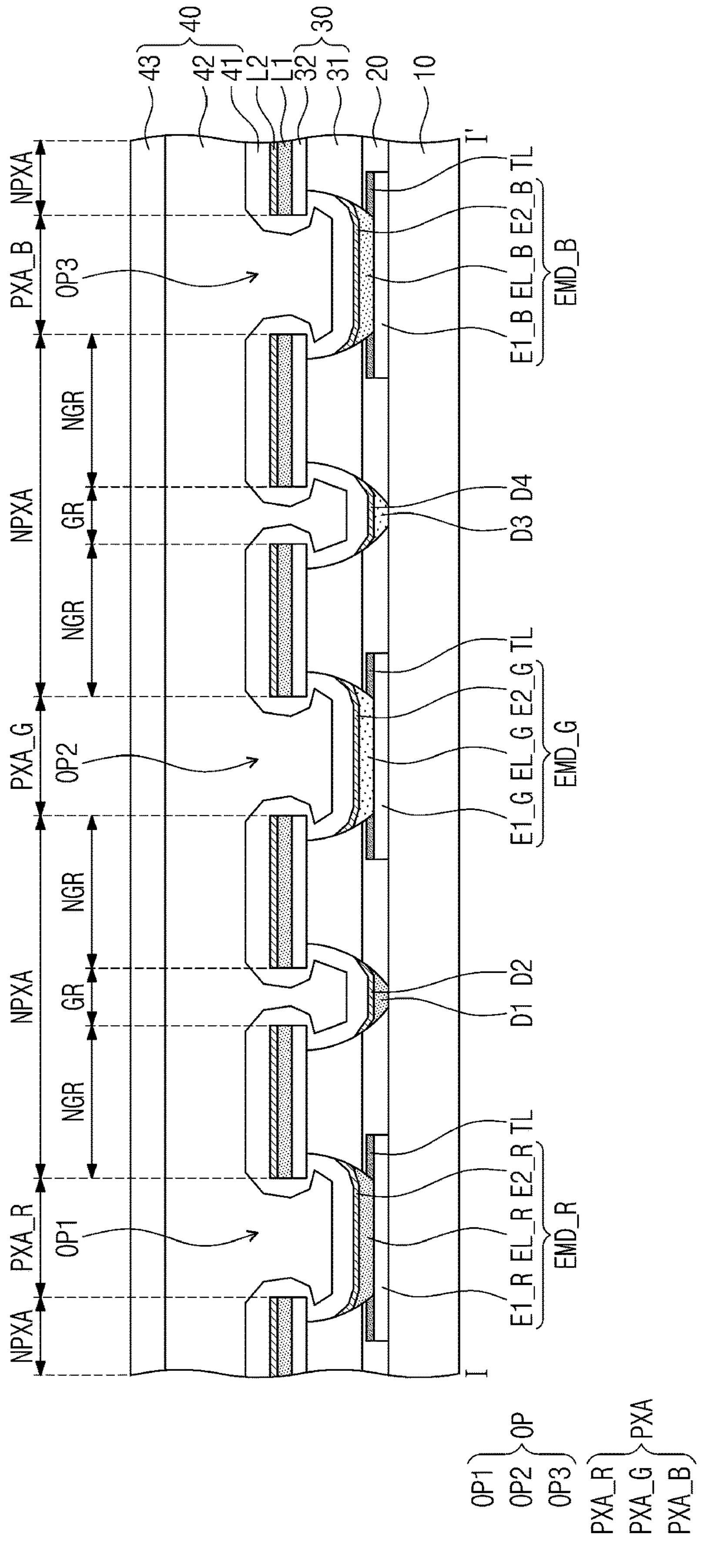
FIG. 3B is a schematic cross-sectional view taken along I-I' illustrated in FIG. 3A.

FIG. 3A is a schematic plan view illustrating a part of a display panel according to an embodiment. FIG. 3B is a schematic cross-sectional view taken along I-I' illustrated in FIG. 3A. FIGS. 3A and 3B illustrate that some components may be omitted for convenience of description. Hereinafter, the disclosure will be described with reference to FIGS. 3A and 3B.

As illustrated in FIG. 3A, an active region AA of a display panel 100 may include light-emitting regions PXA and a non-light-emitting region NPXA adjacent thereto. The light-emitting regions PXA may include a first light-emitting region PXA_R, a second light-emitting region PXA_G, and a third light-emitting region PXA_B. The non-light-emitting region NPXA may surround the first to third light-emitting regions PXA_R, PXA_G, and PXA_B.

The colors of light displayed by the first to third light-emitting regions PXA_R, PXA_G, and PXA_B may be independently designed. In an embodiment, it is illustrated that the first to third light-emitting regions PXA_R, PXA_G, and PXA_B display light having colors different from each other. For example, the first light-emitting region PXA_R may display red light, the second light-emitting region PXA_G may display green light, and the third light-emitting region PXA_B may display blue light. However, this is illustrated as an example, colors of light displayed by the first to third light-emitting region PXA_R, PXA_G, and PXA_B may be the same as each other, or at least some of the light-emitting regions may display the same color, and an embodiment is not limited thereto.

The first to third light-emitting regions PXA_R, PXA_G, and PXA_B may be designed to have shapes independent of each other on a plane. In an embodiment, it is illustrated that the first to third light-emitting regions PXA_R, PXA_G, and PXA_B respectively have areas different from each other. For example, the first light-emitting region PXA_R and the third light-emitting region PXA_B may have rhombic shapes respectively having areas different from each other, and the second light-emitting region PXA_G may have an octagonal shape having an area smaller than the first light-emitting region PXA_R and the third light-emitting region PXA_B. However, this illustrated as an example, the areas and shapes of the first to third light-emitting region PXA_R, PXA_G, and PXA_B may be variously changed according to the number of each of the first to third light-emitting regions PXA_R, PXA_G, and PXA_B, or colors of light displayed by the first to third light-emitting region PXA_R, PXA_G, and PXA_B, and an embodiment is not limited thereto.

Referring to FIG. 3B, the display panel 100 may include a base layer BL, a pixel driver PC, an intermediate layer 10, a first bank layer 20, a second bank layer 30, light-emitting elements EMD_R, EMD_G, and EMD_B, and an encapsulation layer 40. The first to third light-emitting elements EMD_R, EMD_G, and EMD_B are illustrated, for example, as the light-emitting elements EMD_R, EMD_G, and EMD_B.

The base layer BL may have an insulating property. For example, the base layer BL may include glass, plastic, a polymer film, or a multi-layered structure including an organic film and an inorganic film. In an embodiment, it is illustrated that the base layer BL is optically transparent, but an embodiment is not limited thereto. The base layer BL may be opaquely provided if necessary, and is not limited to any one embodiment.

The pixel driver PC is disposed on the base layer BL. The pixel driver PC may include at least one transistor. The pixel driver PC may be provided in plurality to be respectively connected to the first to third light-emitting elements EMD_R, EMD_G, and EMD_B, thereby independently controlling the first to third light-emitting elements EMD_R, EMD_G, and EMD_B.

The pixel driver PC is illustrated as a single block, but this is simply illustrated for convenience of description. The pixel driver PC may include transistors for driving light-emitting elements EMD connected thereto, at least one capacitor, and signal lines for connecting the of transistors and the at least one capacitor, and may further include an insulating layer, a semiconductor pattern, a conductive pattern, etc., for forming various elements.

The intermediate layer 10 is disposed on the base layer BL to cover the pixel driver PC. The intermediate layer 10 may be an insulating layer disposed between the pixel driver PC and the light-emitting elements EMD_R, EMD_G, and EMD_B. The intermediate layer 10 may include an organic material and/or an inorganic material, and may be a single- or multi-layer. In an embodiment, the intermediate layer 10 may be an organic film.

The first to third light-emitting elements EMD_R, EMD_G, and EMD_B are disposed on the intermediate layer 10. The first to third light-emitting elements EMD_R, EMD_G, and EMD_B may each have a multi-layered structure. For example, the first light-emitting element EMD_R may include a first anode E1_R, a first organic layer EL_R, and a first cathode E2_R, the second light-emitting element EMD_G may include a second anode E1_G, a second organic layer EL_G, and a second cathode E2_G, and the third light-emitting element EMD_B may include a third anode E1_B, a third organic layer EL_B, and a third cathode E2_B.

The first to third light-emitting elements EMD_R, EMD_G, and EMD_B may be physically separated. The first to third anodes E1_R, E1_G, and E1_B, the first to third organic layers EL_R, EL_G, and EL_B, and the first to third cathodes E2_R, E2_G, and E2_B may be patterns separated from each other.

The first to third anodes E1_R, E1_G, and E1_B may have a conductive property. For example, as long as having a conductive property, each of the first to third anodes E1_R, E1_G, and E1_B may be formed of various materials such as metal, transparent conductive oxide, or a conductive polymer material. For example, the metal may include gold (Au), silver (Ag), aluminum (Al), magnesium (Mg), lithium (Li), molybdenum (Mo), copper (Cu), or an alloy. The transparent conductive oxide may include indium-tin oxide, indium-zinc oxide, zinc oxide, indium oxide, indium-gallium oxide, or aluminum zinc oxide.

In an embodiment, each of the first to third anodes E1_R, E1_G, and E1_B is illustrated as a single layer, but this is illustrated as an example. Each of the first to third anodes E1_R, E1_G, and E1_B may have a multi-layered structure, any one among the first to third anodes E1_R, E1_G, and E1_B may have a single-layered structure, and the others may each have a multi-layered structure, and an embodiment is not limited thereto.

The first to third organic layers EL_R, EL_G, and EL_B are respectively disposed on the first to third anodes E1_R, E1_G, and E1_B. Each of the first to third organic layers EL_R, EL_G, and EL_B may include at least one light-emitting layer. For example, the first organic layer EL_R may include a light-emitting layer that emits first-color light, the second organic layer EL_G may include a light-emitting layer that emits second-color light, and the third organic layer EL_B may include a light-emitting layer that emits third-color light.

Each of the first to third organic layers EL_R, EL_G, and EL_B may further include a functional layer in addition to the light-emitting layer. For example, each of the first to third organic layers EL_R, EL_G, and EL_B may further include at least any one among an electron transport layer, an electron injection layer, a hole transport layer, a hole injection layer, a charge generation layer, an electron-blocking layer, and a hole-blocking layer, but an embodiment is not limited thereto. Although each of the first to third organic layers EL_R, EL_G, and EL_B has a multi-layered structure, respective layers may be separated from each other, and may be formed into independent patterns.

The first to third cathodes E2_R, E2_G, and E2_B may have a conductive property. As long as having a conductive property, the first to third cathodes E2_R, E2_G, and E2_B may be formed of various materials such as metal, transparent conductive oxide, or a conductive polymer material. The first to third cathodes E2_R, E2_G, and E2_B may be formed as optically transparent or translucent electrodes. Accordingly, the light-emitting elements EMD_R, EMD_G, and EMD_B having a top emission light-emitting structure may smoothly emit light. However, this is described as an example, and in case that the light-emitting elements EMD_R, EMD_G, and EMD_B have a bottom emission light-emitting structure, the first to third cathodes E2_R, E2_G, and E2_B may be each formed as a reflective electrode, and an embodiment is not limited thereto.

For example, the first to third cathodes E2_R, E2_G, and E2_B may include silver (Ag), magnesium (Mg), aluminum (Al), platinum (Pt), palladium (Pd), gold (Au), nickel (Ni), neodymium (Nd), iridium (1*r*), chromium (Cr), lithium (Li), calcium (Ca), or an alloy thereof. The transparent conductive oxide may include indium-tin oxide, indium-zinc oxide, zinc oxide, indium oxide, indium-gallium oxide, or aluminum-zinc oxide. The first to third cathodes E2_R, E2_G, and E2_B may be formed of a conductive material having a work function relatively lower than the first to third anodes E1_R, E1_G, and E1_B.

The first bank layer 20 is disposed on the intermediate layer 10.

The first bank layer 20 may be an inorganic insulating film. For example, the first bank layer 20 may include silicon oxide, silicon nitride, or a combination thereof. For example, the first bank layer 20 may have a two-layered structure in which a silicon oxide layer and a silicon nitride layer may be sequentially stacked each other. However, this is described as an example, and as long as the first bank layer 20 is an inorganic insulating film, the material forming the first bank layer 20, or whether the first bank layer 20 is a single layer or a multi-layer may be variously changed, and an embodiment is not limited thereto.

The second bank layer 30 is disposed on the first bank layer 20. In an embodiment, at least a part of the anodes E1_R, E1_G, and E1_B may be exposed by pixel openings OP1, OP2, and OP3, penetrating the first bank layer 20 and the second bank layer 30. The first to third pixel openings OP1, OP2 and OP3 are defined respectively overlapping the first to third anodes E1_R, E1_G, and E1_B, and respectively expose upper surfaces of the first to third anodes E1_R, E1_G, and E1_B. The first to third pixel openings OP1, OP2 and OP3 constitute pixel openings OP. In an embodiment, three pixel openings OP1, OP2 and OP3 are illustrated as an example, but the number of the pixel openings OP may be variously changed. The light-emitting regions PXA may substantially correspond to the pixel openings OP, respectively. The first bank layer 20 and the second bank layer 30 expose at least a part of each of the first to third anodes E1_R, E1_G, and E1_B through the pixel openings OP.

According to an embodiment, each of the light-emitting elements EMD_R, EMD_G, and EMD_B may further include a barrier layer TL. The barrier layer TL may be disposed on an upper surface of each of the anodes E1_R, E1_G, and E1_B, and may be covered by the first bank layer 20. The barrier layer TL exposes at least a part of each of the anodes E1_R, E1_G, and E1_B. The barrier layer TL may be disposed in a position not overlapping the first pixel openings OP1.

The upper surfaces of the anodes E1_R, E1_G, and E1_B according to the disclosure may be spaced apart from the first bank layer 20 on a cross-section. The upper surfaces of the anodes E1_R, E1_G, and E1_B may be substantially in non-contact with a lower surface of the first bank layer 20. In an embodiment, the first bank layer 20 may be in contact with a side surface of each of the anodes E1_R, E1_G, and E1_B, but may be spaced apart the upper surface of each of the first to third anodes E1_R, E1_G, and E1_B with the barrier layer TL therebetween. Since each of the light-emitting elements EMD_R, EMD_G, and EMD_B may further include the barrier layer TL, it is possible to protect the anodes E1_R, E1_G, and E1_B from being damaged in a process for forming the first pixel opening OP1. Detailed description thereof will be made later.

Each of the opening OP may have an undercut shape on a cross-section. The undercut shape may be formed in the second bank layer 30 toward the light-emitting regions PXA.

The second bank layer 30 may include a first layer 31 and a second layer 32 sequentially stacked each other. The first layer 31 is disposed on the first bank layer 20. The first layer 31 may be relatively further recessed than the second layer 32 in the light-emitting regions PXA. For example, the first layer 31 may be formed to have an undercut shape with respect to the second layer 32.

A side surface 32_W (see FIG. 4B), of the second layer 32, defining each of the pixel openings OP1, OP2 and OP3 may further protrude toward the light-emitting regions PXA than a side surface 31_W (see FIG. 4B), of the first layer 31, defining each of the pixel openings OP1, OP2 and OP3. An area of an upper surface of the second layer 32 may be larger than an area of an upper surface of the first layer 31. The first layer 31 has an undercut shape with respect to the second layer 32, and the second layer 32 has an overhang shape with respect to the first layer 31. A part, of the second layer 32, protruding from a side surface of the first layer 31 may form a tip part TP.

The first layer 31 may include a conductive material. The conductive material may include metal, transparent conductive oxide, or a combination thereof. For example, the metal may include gold, silver, aluminum, magnesium, lithium, molybdenum, copper, or an alloy. The transparent conductive oxide may include indium-tin oxide, indium-zinc oxide, zinc oxide, indium oxide, indium-gallium oxide, or aluminum-zinc oxide.

The second layer 32 may include an inorganic material. The inorganic material may include metal, transparent conductive oxide, or non-metal. For example, the metal may include gold, silver, aluminum, magnesium, lithium, molybdenum, titanium, copper, or an alloy. The non-metal may include silicon, silicon oxide, silicon nitride, silicon oxynitride, a metal oxide, a metal nitride, or a combination thereof.

In an embodiment, the first layer 31 and the second layer 32 may be formed of materials different from each other. For example, the first layer 31 may have a higher electrical conductivity than the second layer 32. For example, the first layer 31 may include aluminum or copper, and the second layer 32 may include molybdenum or titanium.

In an embodiment, the first layer 31 may have a relatively greater thickness than the second layer 32. The first layer 31 may be in direct contact with the first to third cathodes E2_R, E2_G, and E2_B. The first to third cathodes E2_R, E2_G, and E2_B may be physically separated by the second layer 32 forming the tip part TP to be respectively formed in the pixel openings OP, may contact the first layer 31 to be electrically connected to each other, and thus receive a common voltage. The first layer 31 may have a relatively higher electrical conductivity and a relatively greater thickness than the second layer 32, so that a contact resistance with the first to third cathodes E2_R, E2_G, and E2_B may be reduced. Accordingly, a common cathode voltage may be equally provided to the light-emitting regions PXA_R, PXA_G, and PXA_B.

The non-light-emitting region NPXA may include a groove GR region and a planar region NGR. Grooves GR may not be disposed in the planar region NGR of the non-light-emitting region NPXA. The grooves GR may be defined by peripheral openings OPG.

The peripheral openings OPG defining the grooves GR may be formed by penetrating the first bank layer 20 and the second bank layer 30. An inner surface of each of the peripheral openings OPG may have a substantially undercut shape on a cross-section. A side surface, of the second layer 32, facing each of the peripheral openings OPG relatively further protrudes than a side surface, of the first layer, facing each of the peripheral openings OPG 31, thereby forming the tip part.

Accordingly, the first deposition layer L1 and the second deposition layer L2 may be disconnected along the grooves GR. At least one of dummy patterns D1, D2, D3, and D4 may be disposed in the grooves GR, and each of the dummy patterns D1, D2, D3, and D4 may include the same material or similar material as any one of the organic layers EL_R, EL_G, and EL_B, or may include the same material or similar material as the cathodes E2_R, E2_G, and E2_B. For example, in case that the organic layers EL_R, EL_G, and EL_B and the cathodes E2_R, E2_G, and E2_B are formed, the dummy patterns D1, D2, D3, and D4 may be formed, or may be formed as a result of separating the organic layers EL_R, EL_G, and EL_B or the cathodes E2_R, E2_G, and E2_B.

The grooves GR may be spaced apart from the light-emitting regions PXA, for example, the pixel openings OP. The grooves GR may be formed between the light-emitting regions PXA adjacent to each other. Referring FIGS. 3A and 3B, it is illustrated that the grooves GR are provided between all light-emitting regions PXA, but an embodiment is not limited thereto. The grooves GR may be present in a part of the light-emitting regions PXA, for example, between the first light-emitting region PXA_R and the second light-emitting region PXA_G, and may not be present in the other regions. In case that the grooves GR are disposed in the non-light-emitting region NPXA, the grooves GR may be provided at various positions in a diversity of forms, and an embodiment is not limited thereto.

According to the disclosure, since the grooves GR are further included, noise generation, poor driving quality, or the like caused by a lateral leakage current between the light-emitting elements EMD_R, EMD_G, and EMD_B adjacent to each other may be prevented. Accordingly, even in a case where the light-emitting elements EMD_R, EMD_G, and EMD_B are physically separated in the openings OP partially incompletely, the grooves GR may distinctly separate the light-emitting elements EMD_R, EMD_G, and EMD_B. Accordingly, driving characteristics of a display panel may be improved.

As illustrated in FIG. 3A, the grooves GR may include patterns on a plane, and the patterns may be intermittently arranged or disposed. The grooves GR may include the of patterns arranged or disposed along a first diagonal direction DRC1 or a second diagonal direction DRC2. Accordingly, although the grooves GR are formed by penetrating the second bank layer 30, the second bank layer 30 may maintain an electrically integrated shape. Accordingly, while the light-emitting elements EMD_R, EMD_G, and EMD_B adjacent to each other may be more distinctly physically separated by the grooves GR, a common voltage may be stably provided to the entire active region AA through the second bank layer 30. This is illustrated as an example, and the grooves GR may be omitted in a display panel according to an embodiment.

Deposition layers L1 and L2 may be disposed on the second bank layer 30. In an embodiment, the first deposition layer L1 and the second deposition layer L2 sequentially stacked are illustrated as an example, but the deposition layers L1 and L2 may be provided as a single layer or a multi-layer having a number of layers, and an embodiment is not limited thereto.

The first deposition layer L1 may include an organic material. For example, the first deposition layer L1 may include the same material or similar material as the first organic layer EL_R. The first deposition layer L1 may be a layer separated from the first organic layer EL_R during formation of the first organic layer EL_R. For example, the first deposition layer L1 and the first organic layer EL_R may be simultaneously formed through a single process, and may be separated into the first deposition layer L1 and the first organic layer EL_R due to the undercut shape of the second bank layer 30. Detailed description thereof will be made later.

The second deposition layer L2 may include a conductive material. For example, the second deposition layer L2 may include the same material or similar material as the first to third cathodes E2_R, E2_G, and E2_B. The second deposition layer L2 may be separated from the first to third cathodes E2_R, E2_G, and E2_B during formation of the first to third cathodes E2_R, E2_G, and E2_B. For example, the second deposition layer L2 and the first to third cathodes E2_R, E2_G, and E2_B may be simultaneously formed through a single process, and may be separated into the second deposition layer L2 and the first to third cathodes E2_R, E2_G, and E2_B due to the undercut shape of the second bank layer 30. Detailed description thereof will be made later.

The encapsulation layer 40 may include a first inorganic layer 41, an organic layer 42, and a second inorganic layer 43 which may be sequentially stacked each other, but layers constituting the encapsulation layer 40 are not limited thereto.

The first and second inorganic layers 41 and 43 protect the light-emitting elements EMD_R, EMD_G, and EMD_B from moisture and oxygen. The first and second inorganic layers 41 and 43 may include a silicon nitride layer, a silicon oxynitride layer, a silicon oxide layer, a titanium oxide layer, an aluminum oxide layer, or the like within the spirit and the scope of the disclosure. The organic layer 42 may include an acryl-based organic layer, but an embodiment is not limited thereto.

The first inorganic layer 41 caps the light-emitting elements EMD_R, EMD_G, and EMD_B and the deposition layers L1 and L2. The first inorganic layer 41 is formed along inner surfaces of the pixel openings OP1, OP2 and OP3 to cover the tip part of the second bank layer 30, and is formed along an inner surface of the groove GR to cover the dummy layers D1, D2, D3, and D4. The first inorganic layer 41 may be formed with an integrated shape in the active region AA via the light-emitting region PXA and the non-light-emitting region NPXA.

The organic layer 42 may planarize an upper surface of the first inorganic layer 41 to provide the organic layer 42 with a planarized surface, and protect the light-emitting elements EMD_R, EMD_G, and EMD_B from foreign matters such as dust particles.

According to the disclosure, since the first bank layer 20 and the second bank layer 30 are included, the light-emitting elements EMD_R, EMD_G, and EMD_B may be readily physically separated. Accordingly, leakage current or driving error between the light-emitting regions PXA_R, PXA_G, and PXA_B adjacent to each other may be prevented, and the respective light-emitting elements EMD_R, EMD_G, and EMD_B may be independently driven. According to the disclosure, since areas of the light-emitting regions PXA_R, PXA_G, and PXA_B may be reduced, a high-resolution display panel may be readily formed.

The light-emitting elements EMD_R, EMD_G, and EMD_B may be electrically connected through the second bank layer 30 having a conductive property, and therefore a common voltage may be stably applied to the light-emitting elements EMD_R, EMD_G, and EMD_B. According to the disclosure, since each of the light-emitting elements EMD_R, EMD_G, and EMD_B may further include the barrier layer TL, it is possible to prevent a damage to the anodes E1_R, E1_G, and E1_B that may occurs while forming the first bank layer 20 and the second bank layer 30.

Figure 4A:
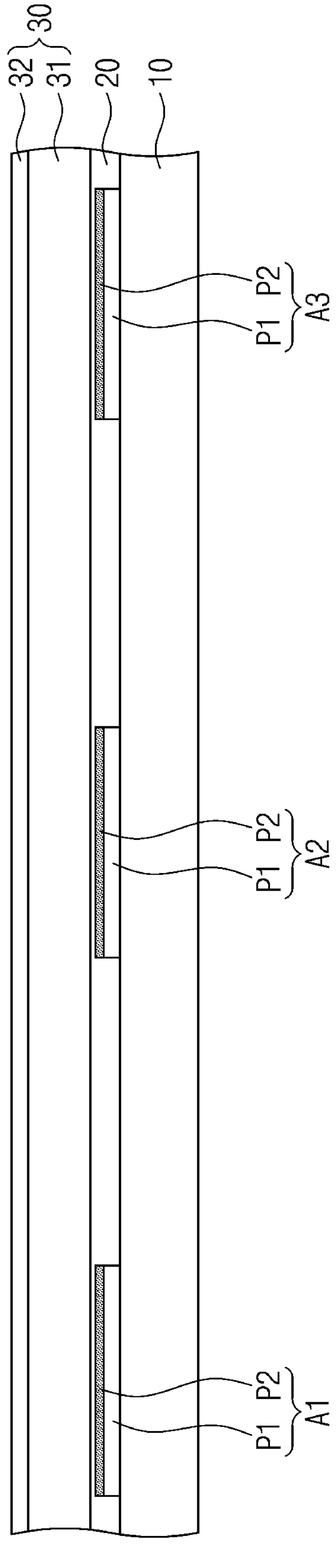
FIGS. 4A to 4Q are schematic cross-sectional views illustrating a display panel manufacturing method according to an embodiment.
Figure 4B:
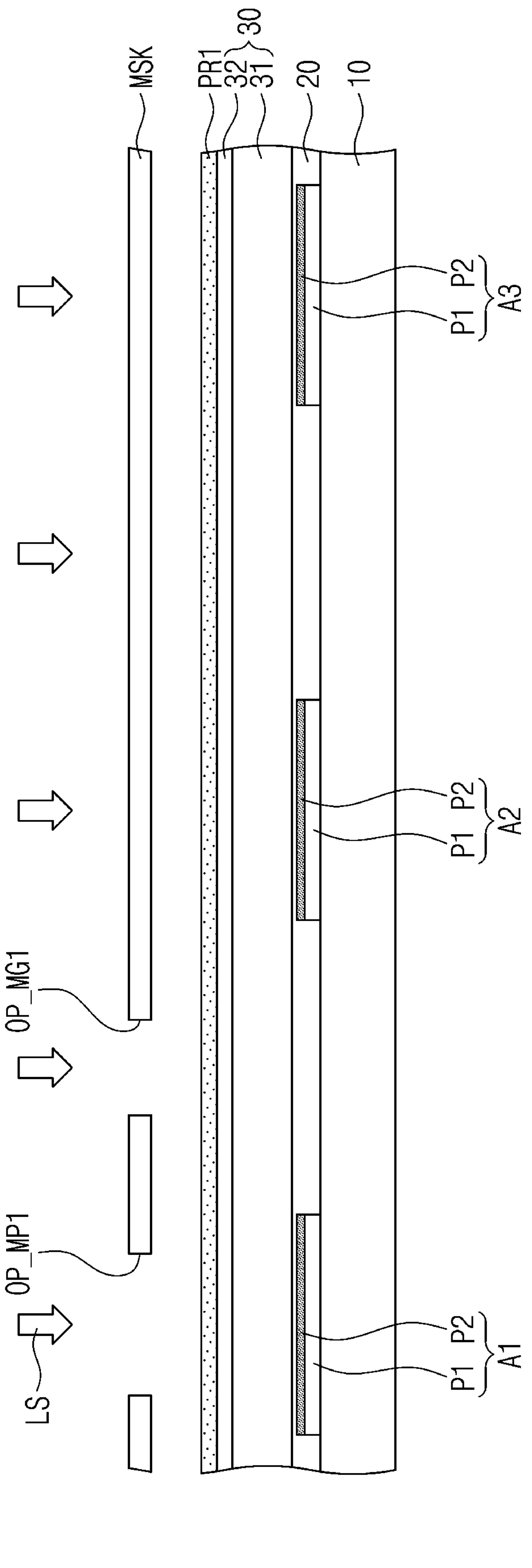
Figure 4C:
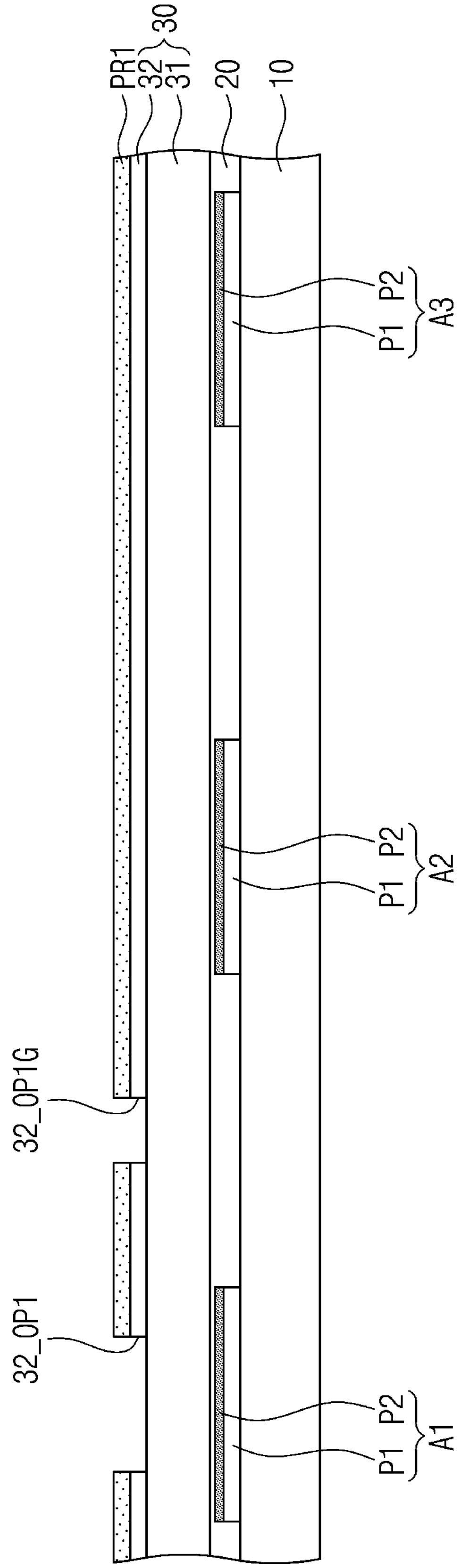
Figure 4D:
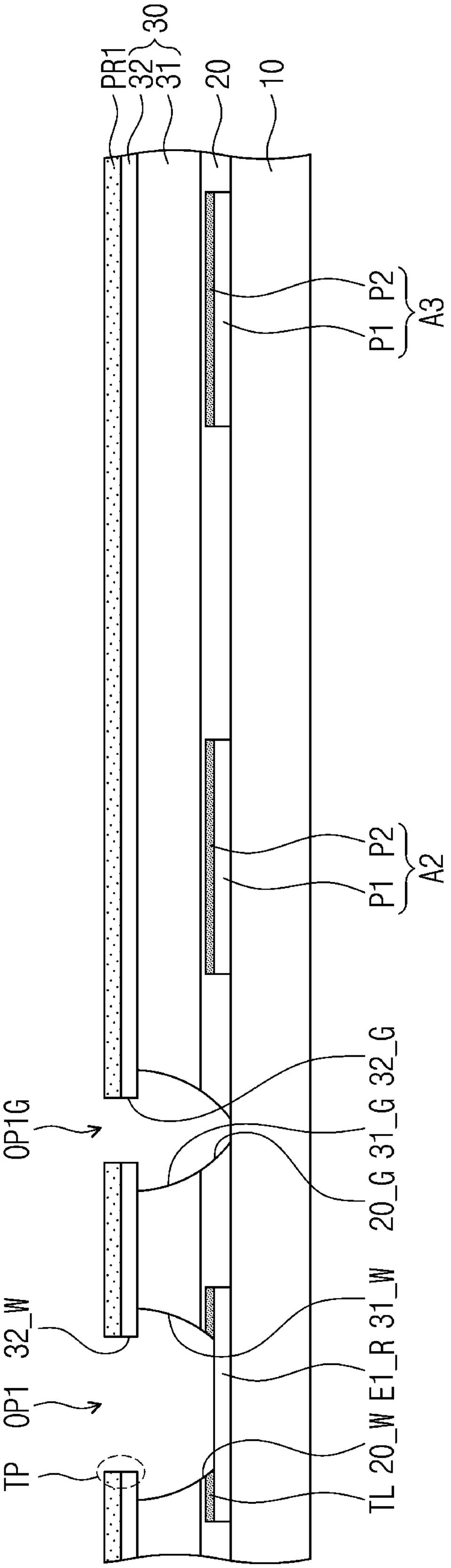
Figure 4E:
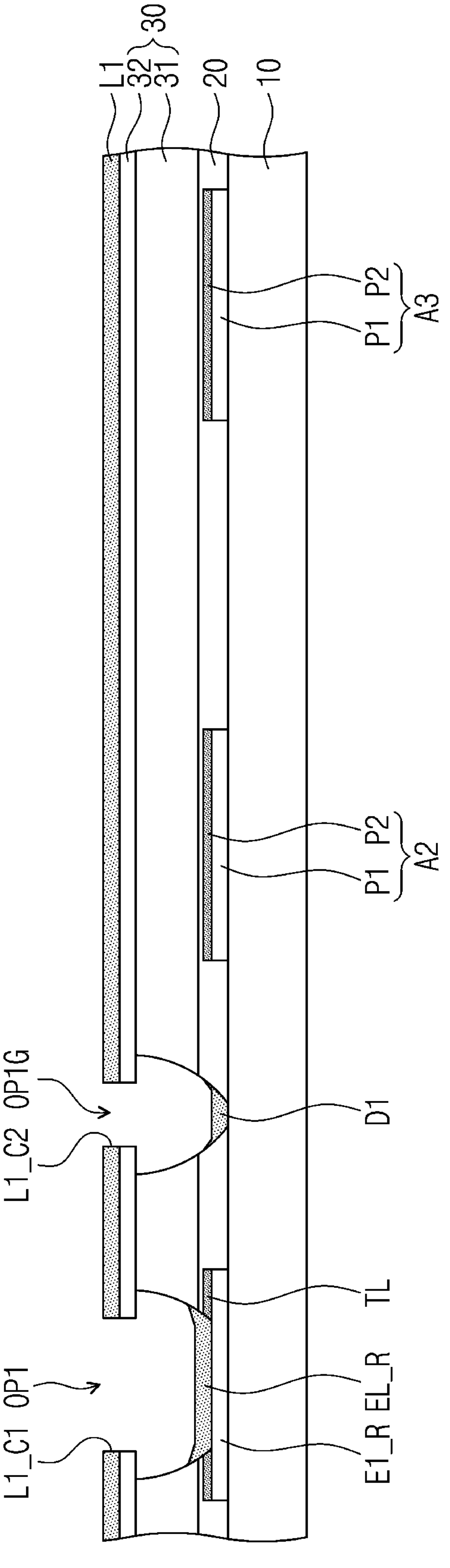
Figure 4F:
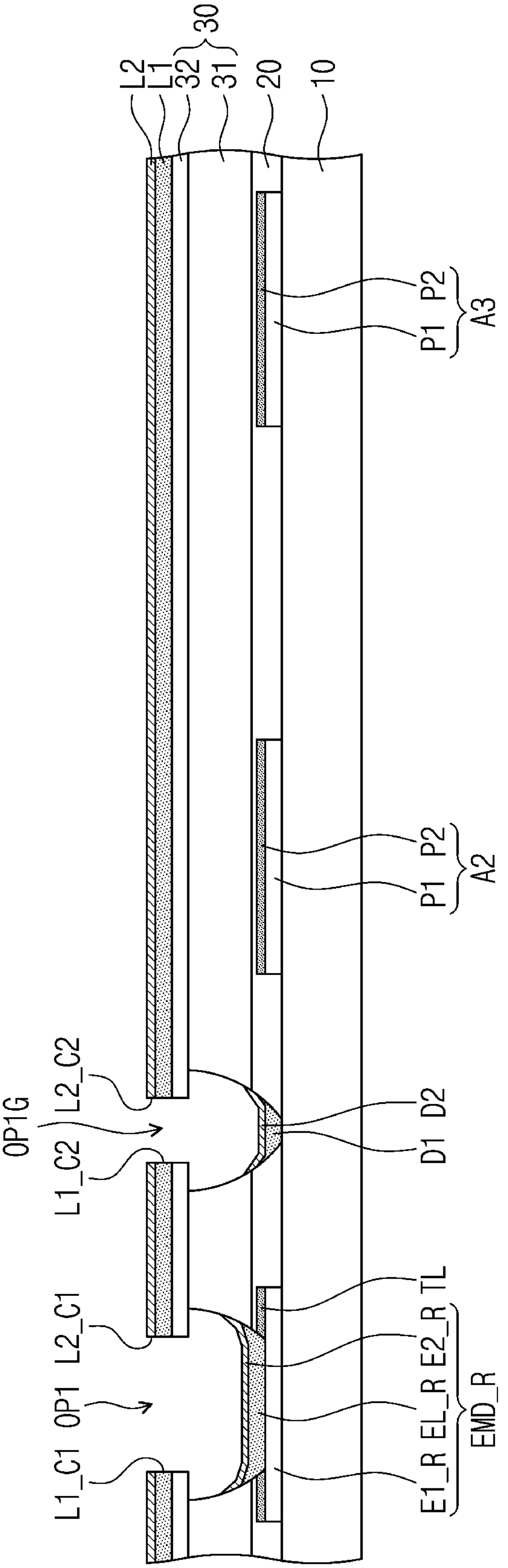
Figure 4G:
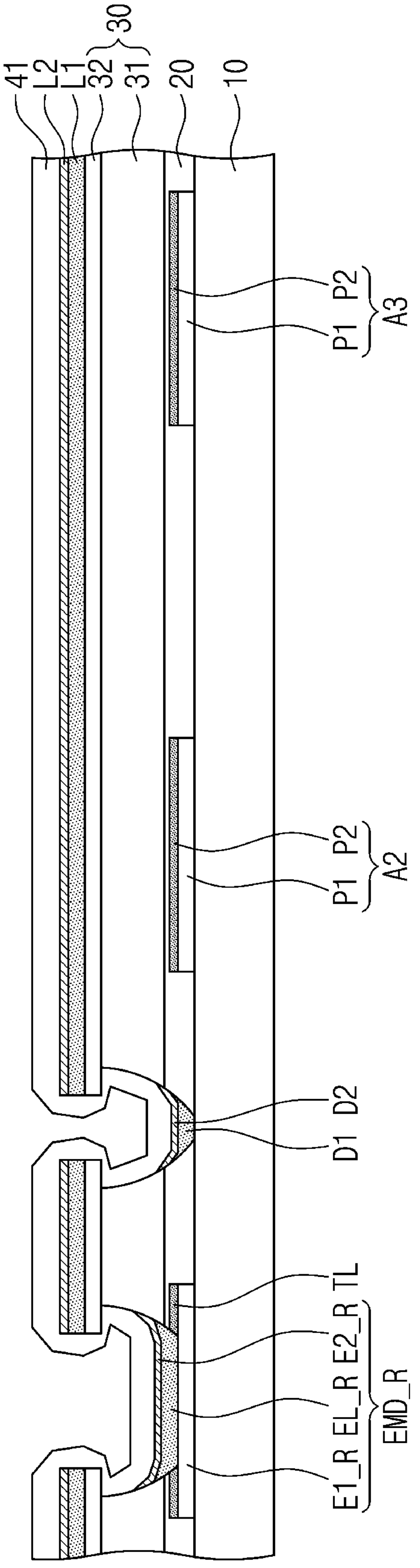
Figure 4H:
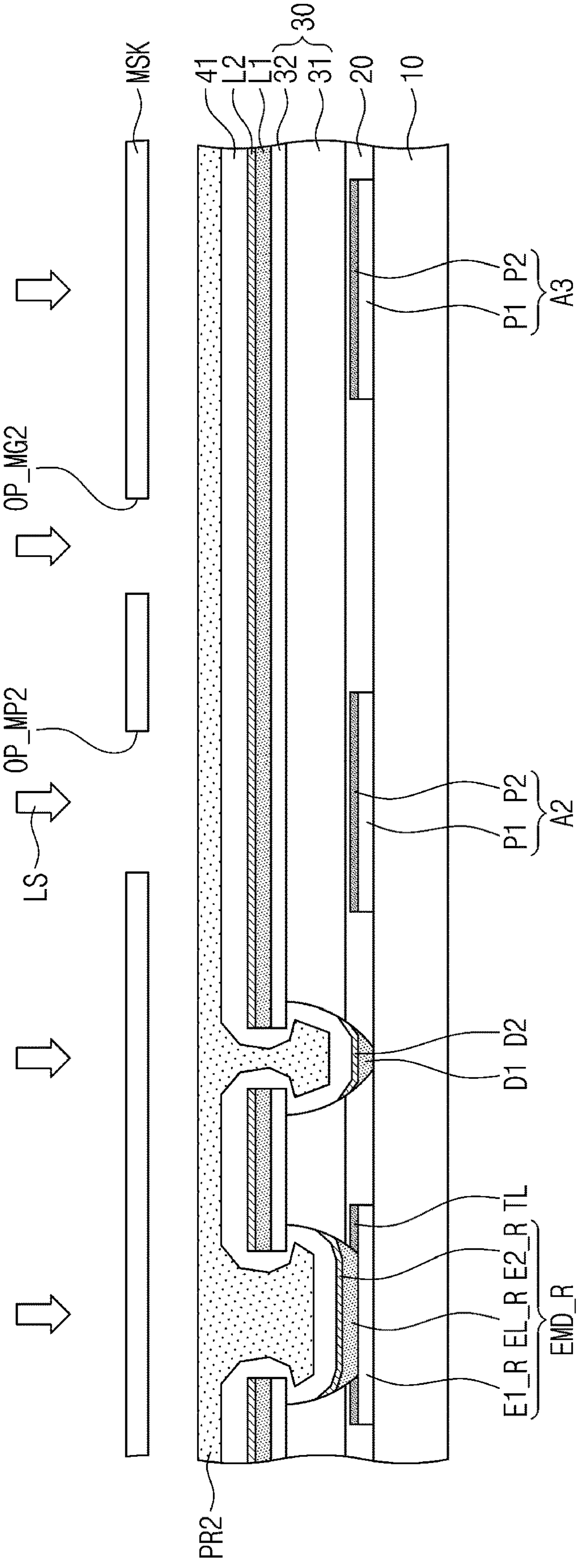
Figure 4I:
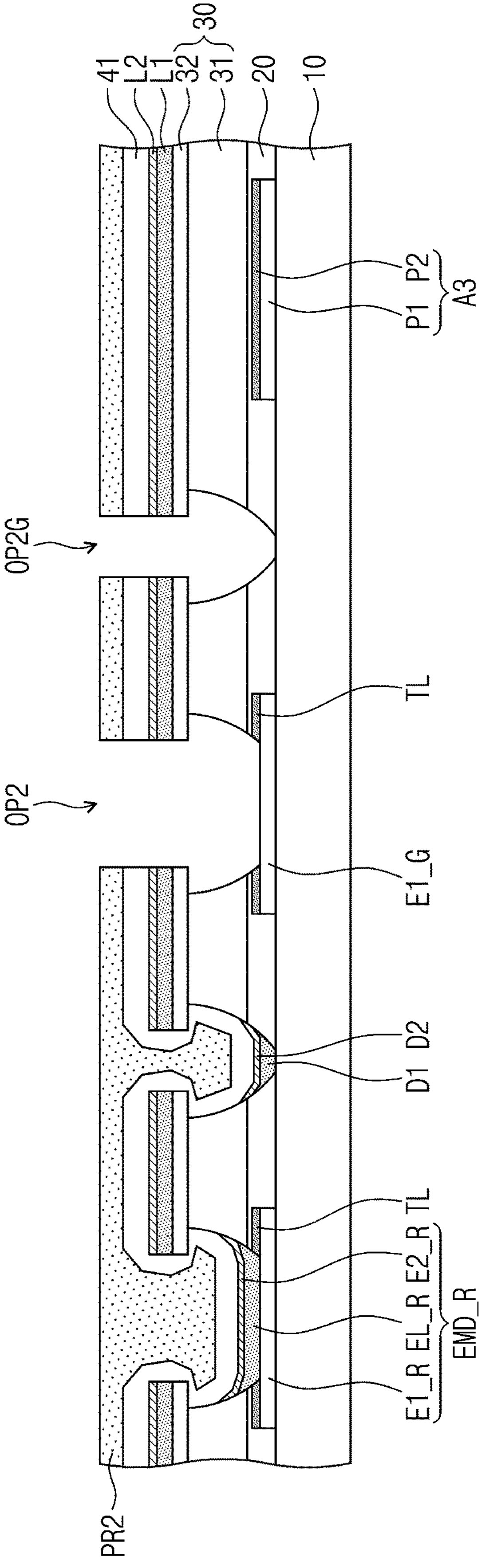
Figure 4J:
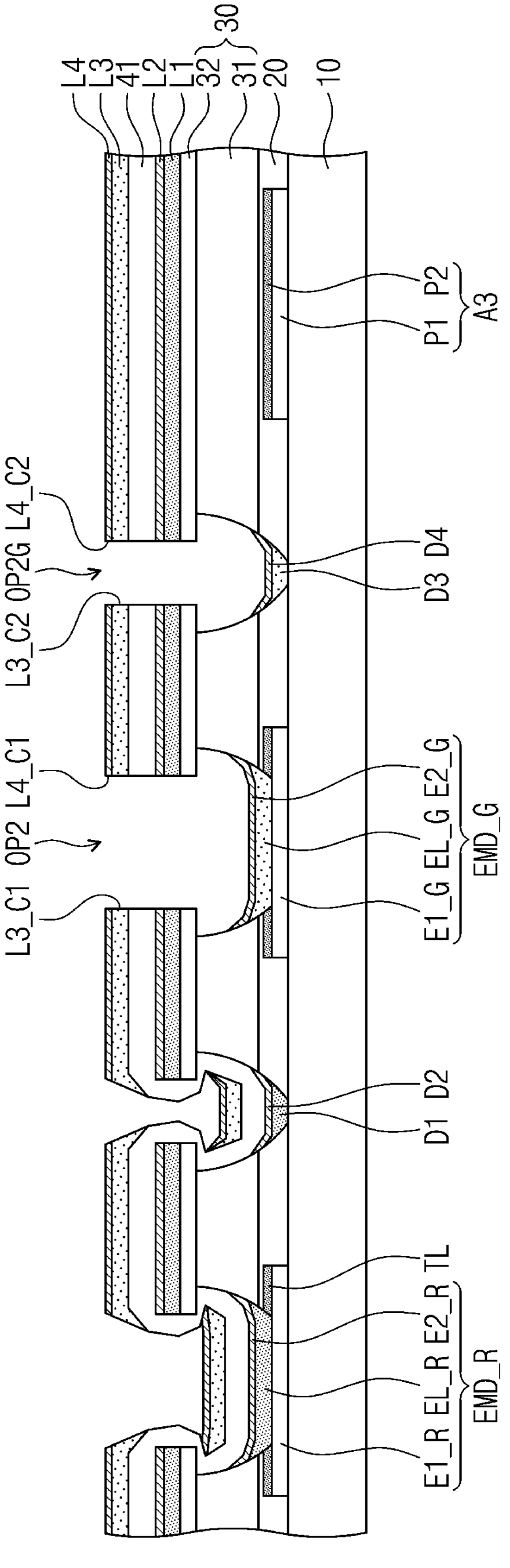
Figure 4K:
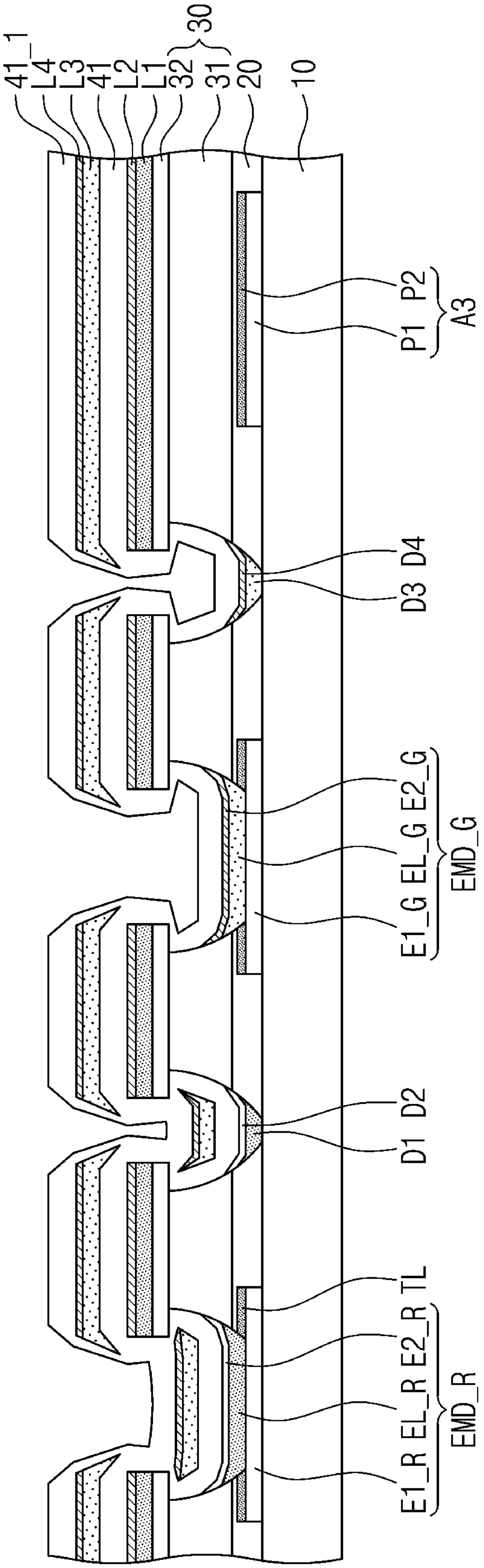
Figure 4L:
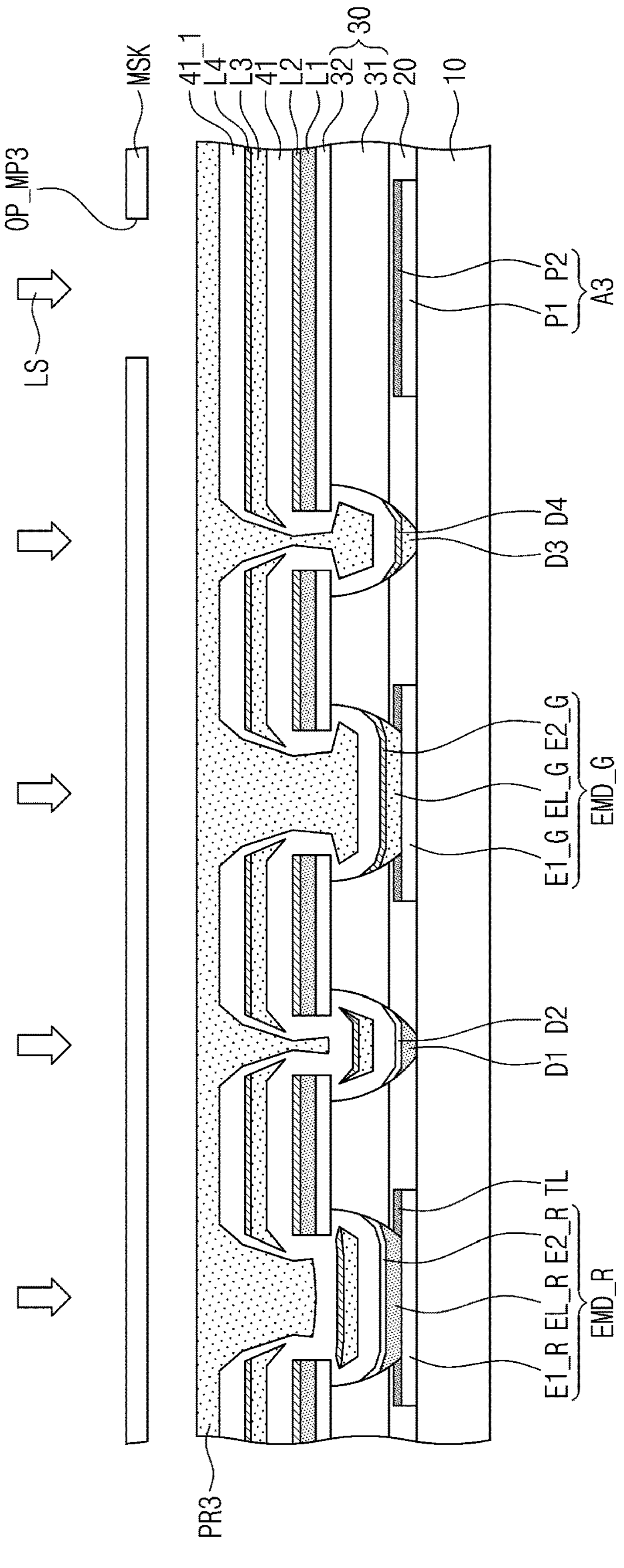
Figure 4M:
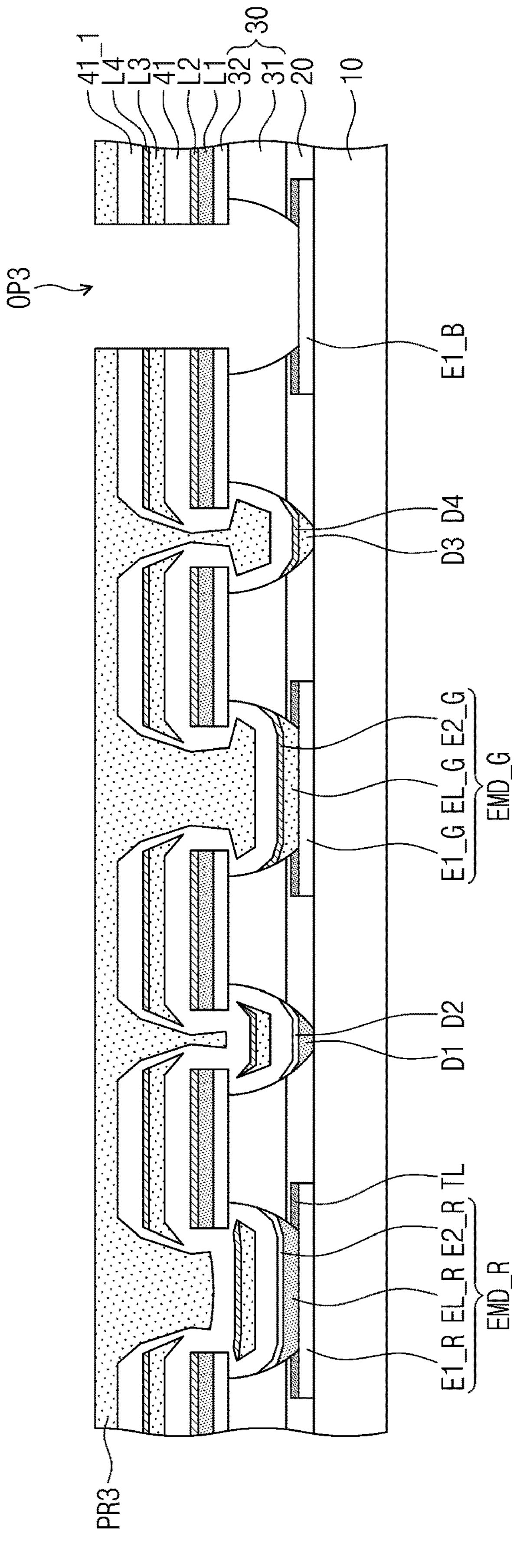
Figure 4N:
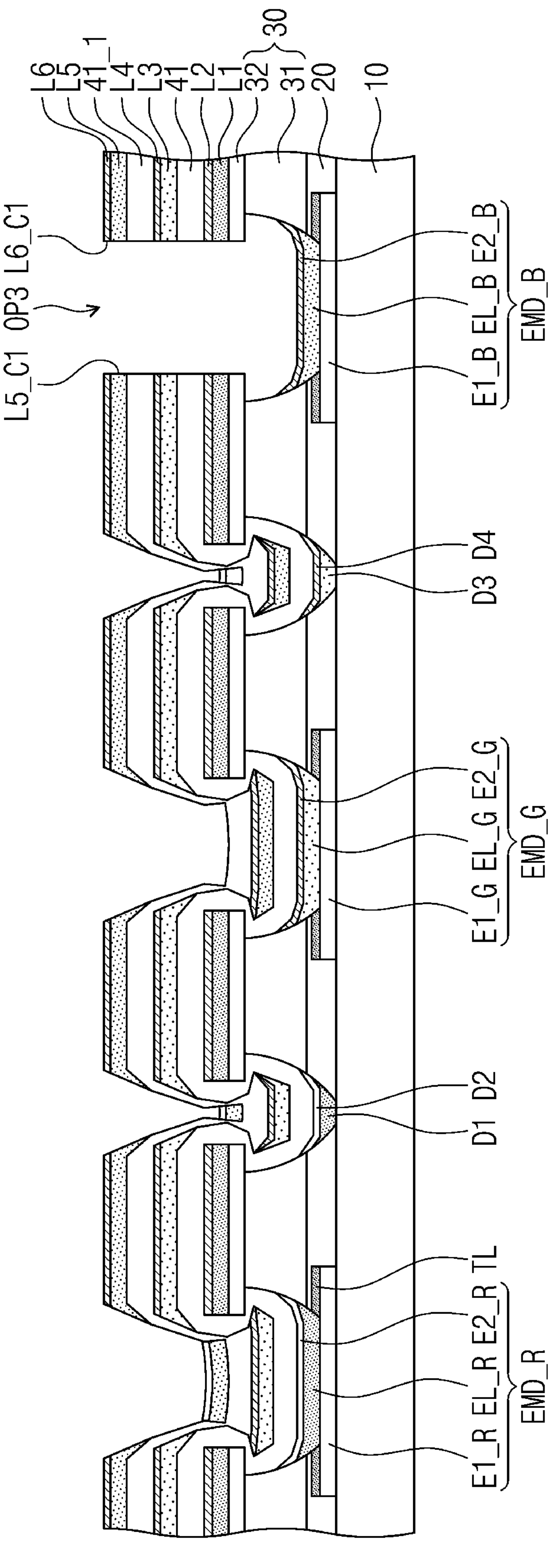
Figure 40:
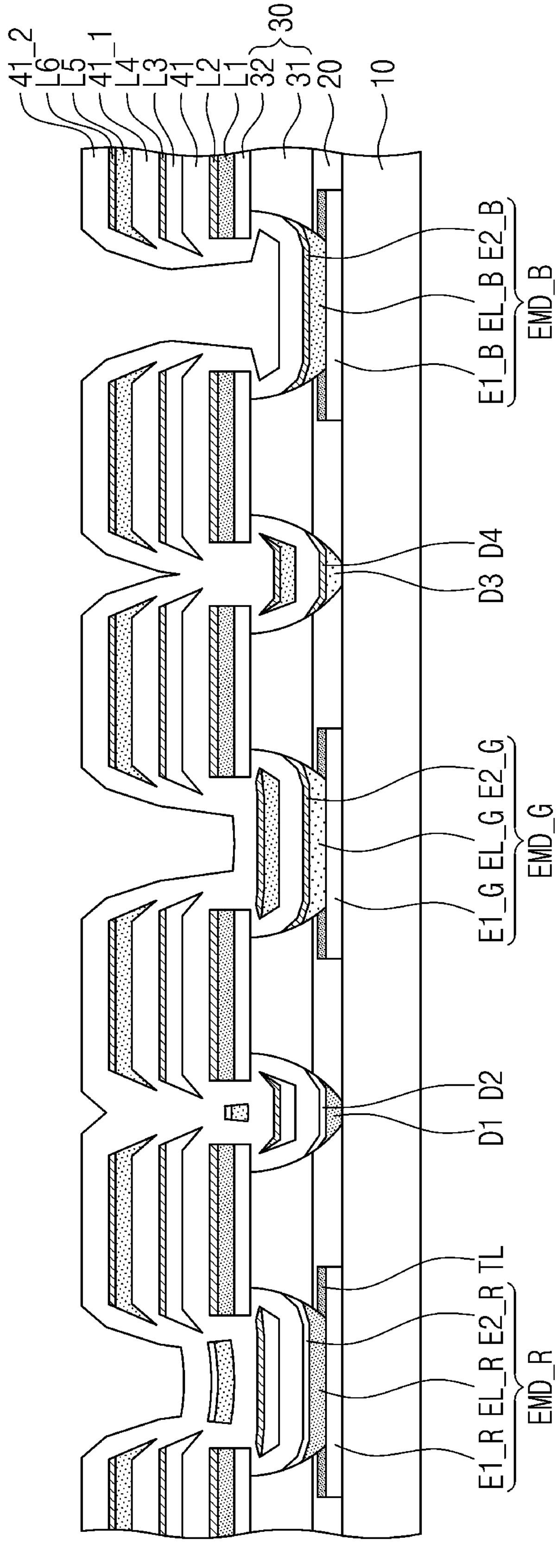
Figure 4P:
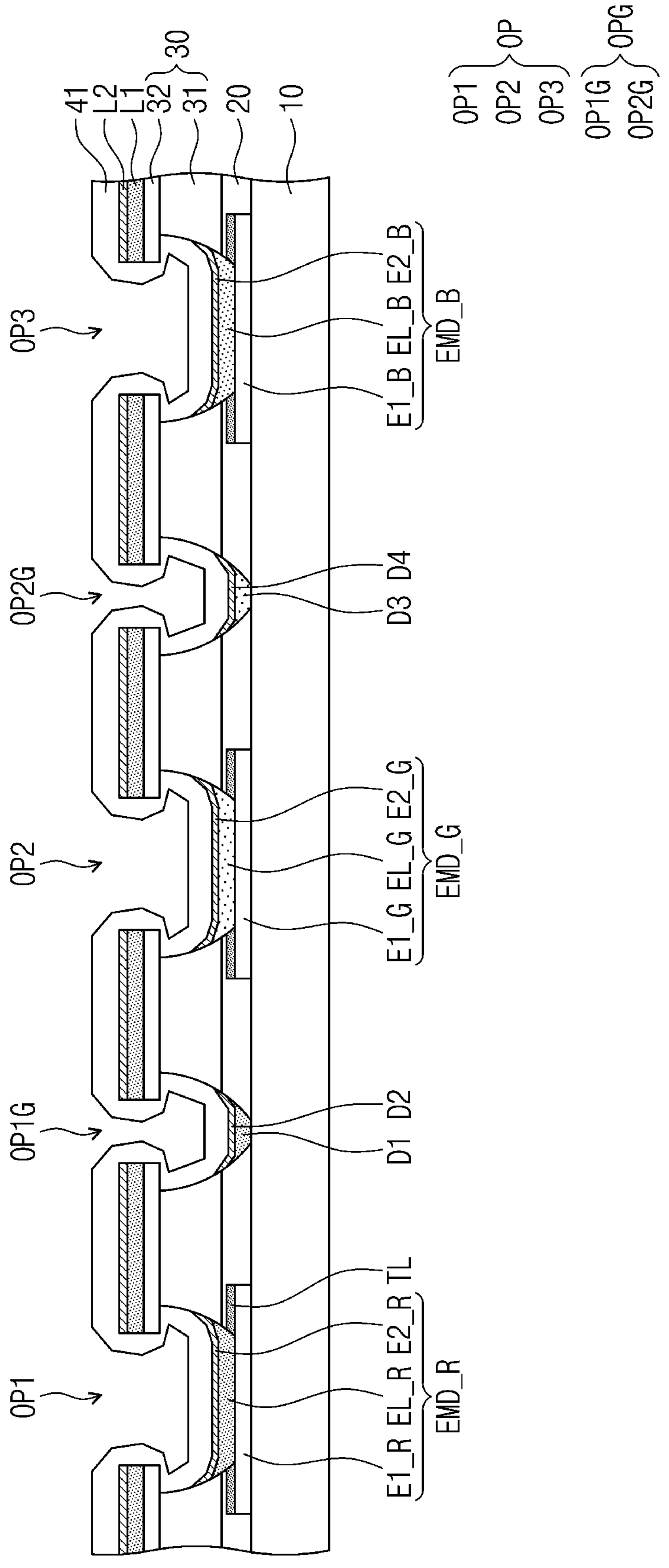
Figure 4Q:
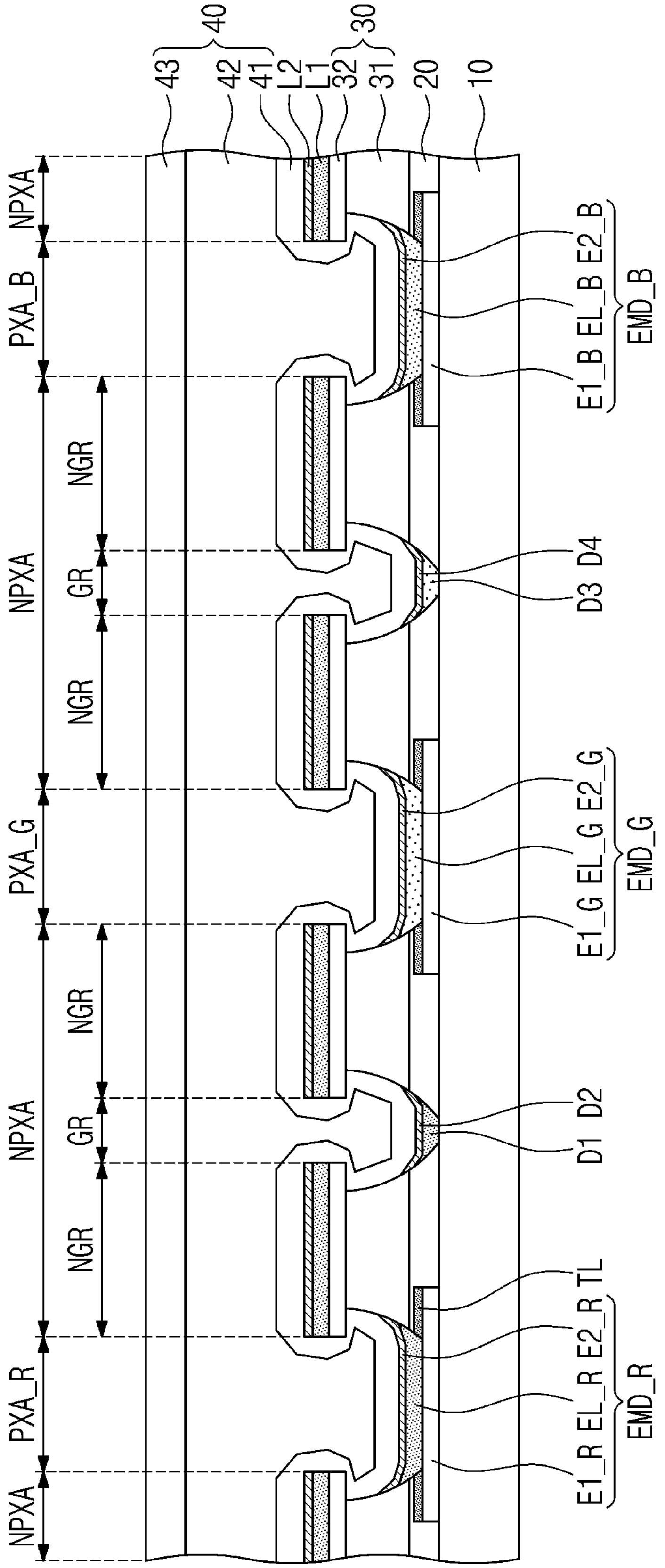

FIGS. 4A to 4Q are schematic cross-sectional views illustrating a display panel manufacturing method according to an embodiment. Hereinafter, the disclosure will be described with reference to FIGS. 4A to 4Q. The same reference numerals or symbols are used for the same components as those described in FIGS. 1 to 3B, and duplicate descriptions therefor will be omitted.

Referring to FIG. 4A, patterns A1, A2, and A3 may be formed on an intermediate layer 10. Each of the patterns A1, A2, and A3 may include a first pattern layer P1 and a second pattern layer P2. The first pattern layer P1 and the second pattern layer P2 may be simultaneously patterned through a single mask.

The first pattern layer P1 may be formed of a conductive material. As long as having a conductive property, the first pattern layer P1 may include various materials such as metal, transparent conductive oxide, or a conductive polymer material. For example, the metal may include gold, silver, aluminum, magnesium, lithium, molybdenum, copper, or an alloy. The transparent conductive oxide may include indium-tin oxide, indium-zinc oxide, zinc oxide, indium oxide, indium-gallium oxide, or aluminum-zinc oxide.

The second pattern layer P2 may include an inorganic material. The inorganic material may include metal, transparent conductive oxide, or non-metal. The second pattern layer P2 may be formed of a material different from the first pattern layer P1, and may be formed to have a relatively smaller thickness than the first pattern layer P1. For example, the second pattern layer P2 may be formed of a conductive oxide such as indium-zinc oxide or indium-gallium-zinc oxide.

Thereafter, a first bank layer 20 and a second bank layer 30 may be sequentially formed on the patterns A1, A2, and A3. The second bank layer 30 may be formed by sequentially stacking a first layer 31 and a second layer 32. The first bank layer 20 may be formed by covering the patterns A1, A2, and A3 through applying or depositing an inorganic material. Thereafter, the first layer 31 of the second bank layer 30 may be formed by applying or depositing a conductive material on the first bank layer 20. As long as having a conductive property, the conductive material may include various materials such as metal, transparent conductive oxide, or a conductive polymer material. For example, the metal may include gold, silver, aluminum, magnesium, lithium, molybdenum, copper, or an alloy. The transparent conductive oxide may include indium-tin oxide, indium-zinc oxide, zinc oxide, indium oxide, indium-gallium oxide, or aluminum-zinc oxide.

Thereafter, the second layer 32 of the second bank layer 30 may be formed by applying or depositing an inorganic material on the first layer 31. The inorganic material may include metal, transparent conductive oxide, or non-metal. For example, the metal may include gold, silver, aluminum, magnesium, lithium, molybdenum, titanium, copper, or an alloy. The non-metal may include silicon, silicon oxide, silicon nitride, silicon oxynitride, a metal oxide, a metal nitride, or a combination thereof.

Thereafter, referring to FIGS. 4B to 4F, a first light-emitting element EMD_R may be formed. First, as illustrated in FIGS. 4B and 4C, the second layer 32 may be patterned using a mask MSK. After a photoresist layer PR1 is formed on the second bank layer 30, the photoresist layer PR1 is patterned by emitting light LS through the mask MSK in which openings OP_MP1 and OP_MG1 are defined. The photoresist layer PR1 may be a negative photoresist layer or a positive photoresist layer, and is not limited to any one photoresist layer.

Afterwards, the second layer 32 may be patterned using the photoresist layer PR1 as a mask. Openings 32_OP1 and 32_OP1G may be formed in the second layer 32 through an etching process. The etching process may be a dry etching, but is not limited thereto.

Thereafter, as illustrated in FIG. 4D, the first layer 31 of the second bank layer 30 and the first bank layer 20 may be sequentially patterned. First openings OP1 and OP1G penetrating the first layer 31 and the first bank layer 20 may be formed through an etching process. The first openings OP1 and OP1G may respectively correspond to a first pixel opening OP1 and a groove opening OP1G. The etching process may be a wet etching, but is not limited thereto.

The first openings OP1 and OP1G may each have an undercut shape on a cross-section. For example, referring to the first pixel opening OP1, a side surface 32_W of the second layer 32 further protrudes toward the first pixel opening OP1 than a side surface 31_W of the first layer 31 to form a tip part TP. For example, since the first layer 31 is etched more than the second layer 32, the side surface 31_W of the first layer 31 may be formed farther away from the center of the first pixel opening OP1 than the side surface 32_W of the second layer 32. A side surface 20_W of the first bank layer 20 may be aligned with the side surface 31_W of the first layer 31.

Likewise, referring to the groove opening OP1G, a side surface 32_G of the second layer 32 further protrudes toward the groove opening OP1G than a side surface 31_G of the first layer 31. For example, since the first layer 31 is etched more than the second layer 32, the side surface 31_G of the first layer 31 may be formed farther away from the center of the groove opening OP1G than the side surface 32_G of the second layer 32. A side surface 20_G of the first bank layer 20 may be aligned with the side surface 31_G of the first layer 31.

The first bank layer 20 is etched to expose the first pattern A1. At this time, the second pattern layer P2 may be etched at the same time in case that the first bank layer 20 is patterned. An etched region of the second pattern layer P2 exposes the first anode E1_R. A remining part of the second pattern layer P2 may be a barrier layer TL. Accordingly, the barrier layer TL exposes a part not overlapping the first bank layer 20 of the first anode E1_R, and covers a part overlapping the first bank layer 20 of the first anode E1_R.

The second pattern layer P2 covers the first anode E1_R during etching of the first bank layer 20 and thus protects the first anode E1_R. Since the second pattern layer P2 blocks a direct contact between an upper surface of the first anode E1_R and the first bank layer 20, the first anode E1_R may not be exposed to an etchant even in case that the first bank layer 20 is etched. The second pattern layer P2 is etched by the etchant to exposes the first pattern layer P1 substantially serving as an electrode, and thus the first anode E1_R is provided.

Thereafter, as illustrated in FIG. 4E, a first deposition layer L1 is formed on the second bank layer 30. The first deposition layer L1 may be formed by deposition of an organic material. The deposition may be a thermal deposition, but is not limited thereto. The organic material may include a light-emitting material. The organic material may further include a hole transport material, a hole injection material, an electron transport material, or an electron injection material. The first deposition layer L1 may be formed as a single layer or a multi-layer, and an embodiment is not limited thereto.

At this time, the first organic layer EL_R and the first deposition layer L1 may be simultaneously formed. The first organic layer EL_R may be formed of the same material or similar material as the first deposition layer L1. The first organic layer EL_R is separated from an end L1_C1 of the first deposition layer L1 and formed in the first pixel opening OP1.

In case that the organic material is deposited, the organic layer may be disconnected by the first openings OP1 and OP1G having an undercut shape. For example, in case that the organic material is deposited, the first organic layer EL_R and the first deposition layer L1 may be separated by the first pixel opening OP1, so that the organic materials be respectively formed on an upper surface of the first anode E1_R and an upper surface of the second bank layer 30. The end L1_C1, facing the first pixel opening OP1, of the first deposition layer L1 may be separated from the first organic layer EL_R. According to the disclosure, patterns EL_R and L1 physically separated from each other may be formed without a patterning process using a separate mask. Accordingly, contact or collision between a mask and the bank layers 20 and 30 may be prevented, and the first organic layer EL_R may be stably formed even in the first pixel opening OP1 having a fine size.

A first dummy layer D1 may be formed in the groove opening OP1G. The first dummy layer D1 may be formed of the same material or similar material as the first deposition layer L1, and an end L1_C2, facing the groove opening OP1G, of the first deposition layer L1 may be separated from the first dummy layer D1. However, this is illustrated as an example, and the first dummy layer D1 may be omitted according to an area of the groove opening OP1G.

Thereafter, the second deposition layer L2 is formed. The second deposition layer L2 may be formed of a conductive material. As long as having a conductive property, the second deposition layer L2 may be formed of various materials such as metal, transparent conductive oxide, or a conductive polymer material. The second deposition layer L2 may be formed by deposition of a conductive material. The deposition may be sputtering, but is not limited thereto.

At this time, the first cathode E2_R and the second deposition layer L2 may be simultaneously formed. The first cathode E2_R may be formed of the same material or similar material as the second deposition layer L2. The first cathode E2_R is separated from an end L2_C1 of the second deposition layer L2 and formed in the first pixel opening OP1. The first cathode E2_R may be in contact with and electrically connected to the first layer 31 of the second bank layer 30.

A second dummy layer D2 may be formed in the groove opening OP1G. The second dummy layer D2 may be formed of the same material or similar material as the second deposition layer L2, and an end L2_C2, facing the groove opening OP1G, of the second deposition layer L2 may be separated from the second dummy layer D2. However, this is illustrated as an example, and the second dummy layer D2 may be omitted depending on the area of the groove opening OP1G.

Thereafter, as illustrated in FIG. 4G, a first inorganic layer 41 is formed. The first inorganic layer 41 may be formed by deposition of an inorganic material. The deposition may be chemical vapor deposition, but is not limited thereto.

The first inorganic layer 41 may be formed along an upper surface of the second deposition layer L2 and inner surfaces of the openings OP1 and OP1G described above. The first inorganic layer 41 may be formed in an integrated shape across the entire intermediate layer 10, and may all cap the ends L1_C1, L1_C2, L2_C1, and L2_C2 of the first and second deposition layers L1 and L2, the dummy layers D1 and D2, and the first light-emitting element EMD_R.

Thereafter, referring to FIGS. 4H to 4K, a second light-emitting element EMD_G may be formed. First, as illustrated in FIGS. 4H and 41, openings OP2 and OP2G may be formed using a mask MSK. After a photoresist layer PR2 is formed on the first inorganic layer 41, the photoresist layer PR2 is patterned by emitting light LS through the mask MSK in which openings OP_MP2 and OP_MG2 are defined. Thereafter, the first inorganic layer 41, the second deposition layer L2, the first deposition layer L1, and the second layer 32 may be patterned through an etching process, using the photoresist layer PR2 as a mask. The etching process may be a dry etching, but is not limited thereto.

Afterwards, the first layer 31 and the first bank layer 20 may be patterned through an etching process. The etching process may be a wet etching, but is not limited thereto. Since the first layer 31 and the first bank layer 20 are etched, the second anode E1_G may be exposed in the second pixel opening OP2. The groove opening OP2G may be simultaneously formed spaced apart from the second pixel opening OP2.

The second openings OP2 and OP2G may each have an undercut shape on a cross-section. In case that the first bank layer 20 is patterned, the second pattern layer P2 may be simultaneously patterned to expose the anode E1_G, and a part thereof may remain to serve as the barrier layer TL.

Thereafter, as illustrated in FIG. 4J, a third deposition layer L3 and a fourth deposition layer L4 may be sequentially formed. The third deposition layer L3 may be formed by deposition of an organic material. The deposition may be a thermal deposition, but is not limited thereto. The organic material may include a light-emitting material. The organic material may further include a hole transport material, a hole injection material, an electron transport material, or an electron injection material. The third deposition layer L3 may be formed as a single layer or a multi-layer, but an embodiment of the disclosure is not limited thereto.

At this time, the second organic layer EL_G and the third deposition layer L3 may be simultaneously formed. The second organic layer EL_G may be formed of the same material or similar material as the third deposition layer L3. The second organic layer EL_G is separated from an end L3_C1 of the third deposition layer L3 and formed in the second pixel opening OP2.

Thereafter, the fourth deposition layer L4 is formed. The fourth deposition layer L4 may be formed of a conductive material. As long as having a conductive property, the fourth deposition layer L4 may be formed of various materials such as metal, transparent oxide, or a conductive polymer material. In an embodiment, the fourth deposition layer L4 may be formed of the same material or similar material as the second deposition layer L2. The deposition may be sputtering, but is not limited thereto.

At this time, the second cathode E2_G and the fourth deposition layer L4 may be simultaneously formed. The second cathode E2_G may be formed of the same material or similar material as the fourth deposition layer L4. The second cathode E2_G is separated from an end L4_C1 of the fourth deposition layer L4 and formed in the second pixel opening OP2. The second cathode E2_G may be in contact with and electrically connected to the first layer 31 of the second bank layer 30.

A third dummy layer D3 and a fourth dummy layer D4 may be formed in the groove opening OP2G. The third dummy layer D3 is formed to be separated from an end L3_C2 of the third deposition layer L3, and the fourth dummy layer D4 is formed to be separated from an end L4_C2 of the fourth deposition layer L4.

Thereafter, as illustrated in FIG. 4K, a first intermediate inorganic layer 41_1 may be formed. The first intermediate inorganic layer 41_1 may be formed by deposition of an inorganic material, and may be formed of the same material or similar material as the first inorganic layer 41. The deposition may be chemical vapor deposition, but is not limited thereto.

The first intermediate inorganic layer 41_1 may be formed along an upper surface of the fourth deposition layer L4 and inner surfaces of the openings OP2 and OP2G described above. The first intermediate inorganic layer 41_1 may be formed in an integrated shape across the entire intermediate layer 10, and may all cap the ends L3_C1, L3_C2, L4_C1, and L4_C2 of the third and fourth deposition layers L3 and L4, the dummy layers D3 and D4, and the second light-emitting element EMD_G.

Thereafter, referring to FIGS. 4L to 4N, the third light-emitting element EMD_B may be formed. First, as illustrated in FIGS. 4L and 4M, a third pixel opening OP3 may be formed using a mask MSK. After a photoresist layer PR3 is formed on the first intermediate inorganic layer 41_1, the photoresist layer PR3 is patterned by emitting light LS through the mask MSK in which an opening OP_MP3 is defined. Thereafter, the first intermediate inorganic layer 41_1, the fourth deposition layer L4, the third deposition layer L3, the first inorganic layer 41, the second deposition layer L2, the first deposition layer L1, and the second layer 32 may be patterned through an etching process using the photoresist layer PR3 as a mask. The etching process may be a dry etching, but is not limited thereto.

Thereafter, the first layer 31 and the first bank layer 20 may be patterned through an etching process. The etching process may be a wet etching, but is not limited thereto. Since the first layer 31 and the first bank layer 20 are etched, a third anode E1_B may be exposed in the third pixel opening OP3. The third pixel opening OP3 may have an undercut shape on a cross-section. In case that the first bank layer 20 is patterned, the second pattern layer P2 is etched together, so that the third anode E1_B may be exposed, and a part thereof may remain to serve as the barrier layer TL.

Thereafter, as illustrated in FIG. 4N, a fifth deposition layer L5 and a sixth deposition layer L6 may be sequentially formed. The fifth deposition layer L5 may be formed by deposition of an organic material. The deposition may be a thermal deposition, but is not limited thereto. The organic material may include a light-emitting material. The organic material may further include a hole transport material, a hole injection material, an electron transport material, or an electron injection material. The fifth deposition layer L5 may be formed as a single layer or a multi-layer, but an embodiment of the disclosure is not limited thereto.

At this time, the third organic layer EL_B and the fifth deposition layer L5 may be simultaneously formed. The third organic layer EL_B may be formed of the same material or similar material as the fifth deposition layer L5. The third organic layer EL_B is separated from an end L5_C1 of the fifth deposition layer L5 and formed in the third pixel opening OP3.

Thereafter, the sixth deposition layer L6 is formed. The sixth deposition layer L6 may be formed of a conductive material. As long as having a conductive property, the sixth deposition layer L6 may be formed of various materials such as metal, transparent conductive oxide, or a conductive polymer material. In an embodiment, the sixth deposition layer L6 may be formed of the same material or similar material as the second deposition layer L2. The deposition may be sputtering, but is not limited thereto.

At this time, the third cathode E2_B and the sixth deposition layer L6 may be simultaneously formed. The third cathode E2_B may be formed of the same material or similar material as the sixth deposition layer L6. The third cathode E2_B is separated from an end L6_C1 of the sixth deposition layer L6 and formed in the third pixel opening OP3. The third cathode E2_B may be in contact with and electrically connected to the first layer 31 of the second bank layer 30.

Thereafter, as illustrated in FIG. 4O, a second intermediate inorganic layer 41_2 may be formed. The second intermediate inorganic layer 41_2 may be formed by deposition of an inorganic material, and may be formed of the same material or similar material as the first inorganic layer 41. The deposition may be chemical vapor deposition, but is not limited thereto.

The second intermediate inorganic layer 41_2 may be formed along an upper surface of the sixth deposition layer L6 and an inner surface of the third pixel opening OP3. The second intermediate inorganic layer 41_2 may be formed in an integrated shape across the entire intermediate layer 10, and may all cap the ends L5_C1, L5_C2, L6_C1, and L6_C2 of the fifth and sixth deposition layers L5 and L6, and the third light-emitting element EMD_B.

Thereafter, as illustrated in FIG. 4P, all layers on the first inorganic layer 41 are removed. Accordingly, only the light-emitting elements EMD_R, EMD_G, and EMD_B and the first inorganic layer 41 remain in the pixel openings OP1, OP2 and OP3. The deposition layers L3 L4, L5 and L6 or intermediate inorganic layers 41_1 and 41_2 formed after the first inorganic layer 41 may be removed through this process. The removing process may be performed through a strip process, a dry etching, or a wet etching, but an embodiment of the disclosure is not limited thereto.

Thereafter, as illustrated in FIG. 4Q, an encapsulation layer 40 is formed by sequentially forming an organic layer 42 and a second inorganic layer 43. The organic layer 42 may be formed by applying an organic material in an inkjet method, but an embodiment of the disclosure is not limited thereto. The organic layer 42 provides a planarized upper surface. Thereafter, the second inorganic layer 43 may be formed by deposition of an inorganic material.

According to the disclosure, the light-emitting elements EMD_R, EMD_G, and EMD_B may be formed not using a mask, made of metal, such as a metal mask. Accordingly, since a damage caused by a contact with a metal mask may be prevented, and the organic layers EL_R, EL_G, and EL_B may be readily patterned in the light-emitting region PXA_R, PXA_G, and PXA_B having a finer size than an opening provided by the metal mask, a high-resolution display panel may be provided.

According to the disclosure, since the light-emitting elements EMD_R, EMD_G, and EMD_B physically separated from each other are formed, leakage current, color mixing, or the like between the light-emitting elements EMD_R, EMD_G, and EMD_B adjacent to each other may be prevented.

FIGS. 5A to 5J are schematic cross-sectional views illustrating a display panel manufacturing method according to an embodiment. FIG. 6 is an enlarged schematic cross-sectional view illustrating a part of a display panel according to an embodiment of the disclosure. Hereinafter, the disclosure will be described with reference to FIGS. 5A to 6.

FIGS. 5A to 5J illustrate a process of forming a single light-emitting element EMD. FIGS. 5A to 5J may correspond to operations described with reference to FIGS. 4A to 4F. Hereinafter, the same reference numerals or symbols are used for the same components as those described in FIGS. 1 to 4Q, and duplicate descriptions therefor will be omitted.

Figure 5A:
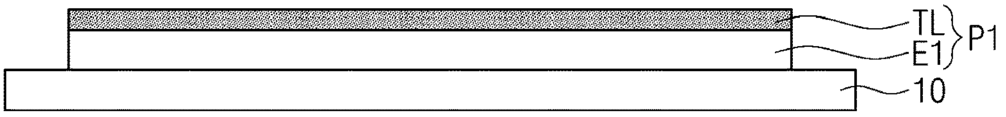
FIGS. 5A to 5J are schematic cross-sectional views illustrating a display panel manufacturing method according to an embodiment.
Figure 6:
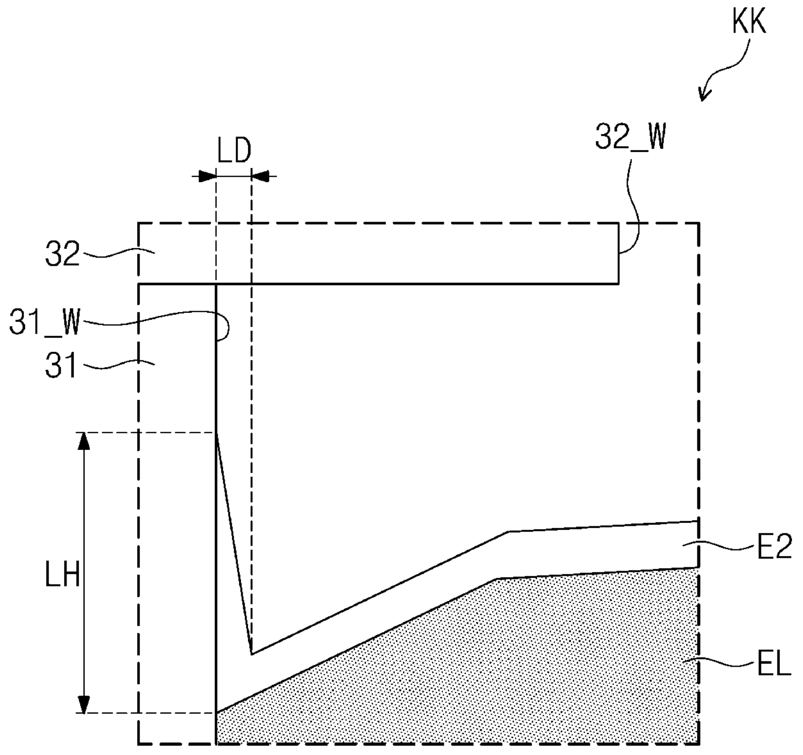
FIG. 6 is an enlarged schematic cross-sectional view illustrating a part of a display panel according to an embodiment.

As illustrated in FIG. 5A, a first pattern layer P1 is formed on an intermediate layer 10. The first pattern layer P1 may be formed by stacking a first electrode E1 and a barrier layer TL. The first electrode E1 may correspond to an anode. The first electrode E1 and the barrier layer TL may be sequentially formed and simultaneously patterned to form the first pattern layer P1. The first pattern layer P1 may correspond to any one among patterns A1, A2, and A3 illustrated in FIG. 4A.

Figure 5B:
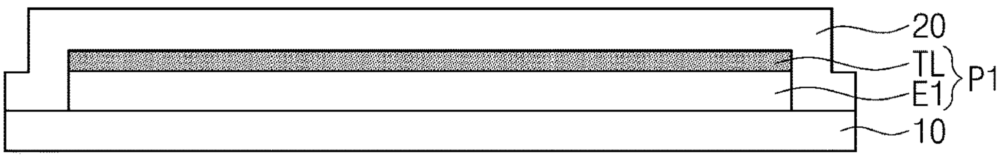

Thereafter, as illustrated in FIG. 5B, a first bank layer 20 is formed. The first bank layer 20 may be formed by depositing or applying an inorganic material.

Figure 5C:
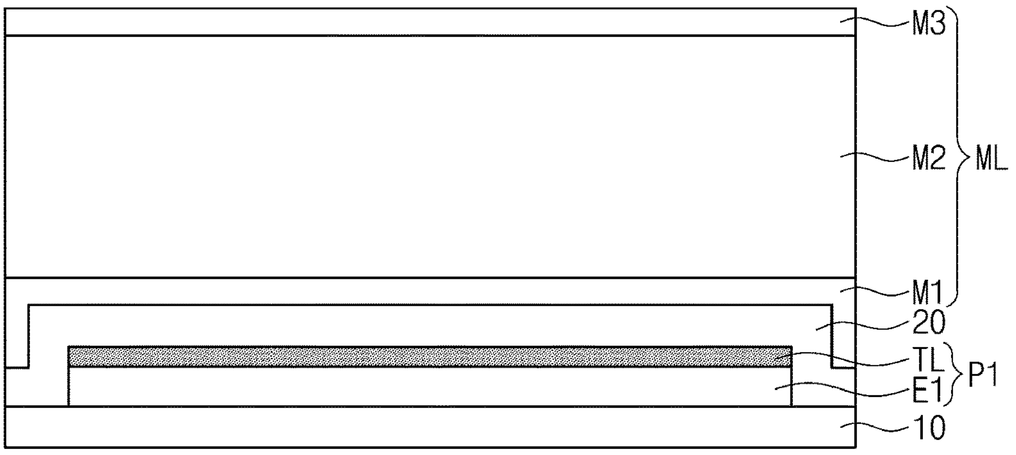

Thereafter, as illustrated in FIG. 5C, an initial layer ML is formed on the first bank layer 20. The initial layer ML may include a first layer M1, a second layer M2, and a third layer M3 sequentially stacked each other.

The first layer M1 may include an inorganic material. The inorganic material may include metal, transparent conductive oxide, or non-metal. The second layer M2 may include a conductive material. The conductive material may include metal or transparent conductive oxide. The second layer M2 may be formed of a material different from the first layer M1. The third layer M3 may include an inorganic material. The inorganic material may include metal, transparent conductive oxide, or non-metal. The third layer M3 may be formed of a material different from the second layer M2.

Figure 5D:
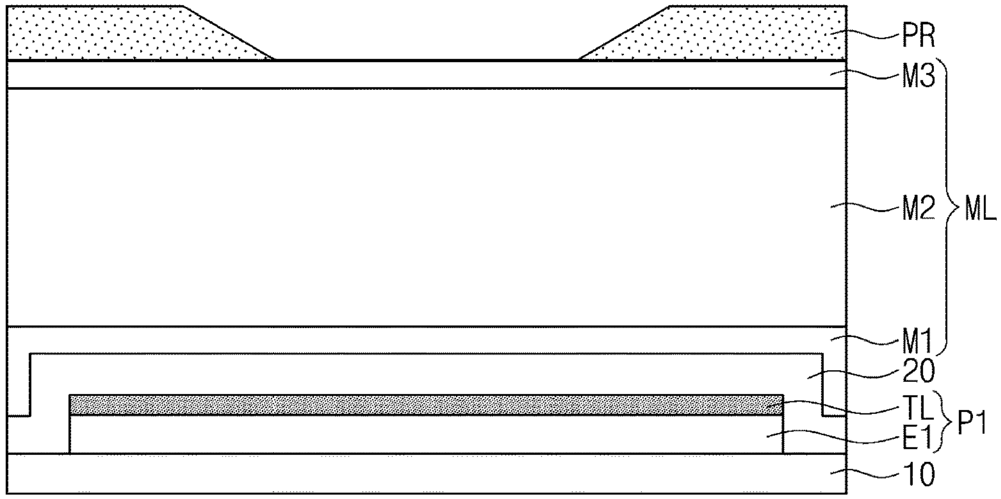

Thereafter, as illustrated in FIG. 5D, a photoresist layer PR is formed on the initial layer ML. An opening is formed in the photoresist layer PR through a photolithographic process to expose a part of the initial layer ML.

Figure 5E:
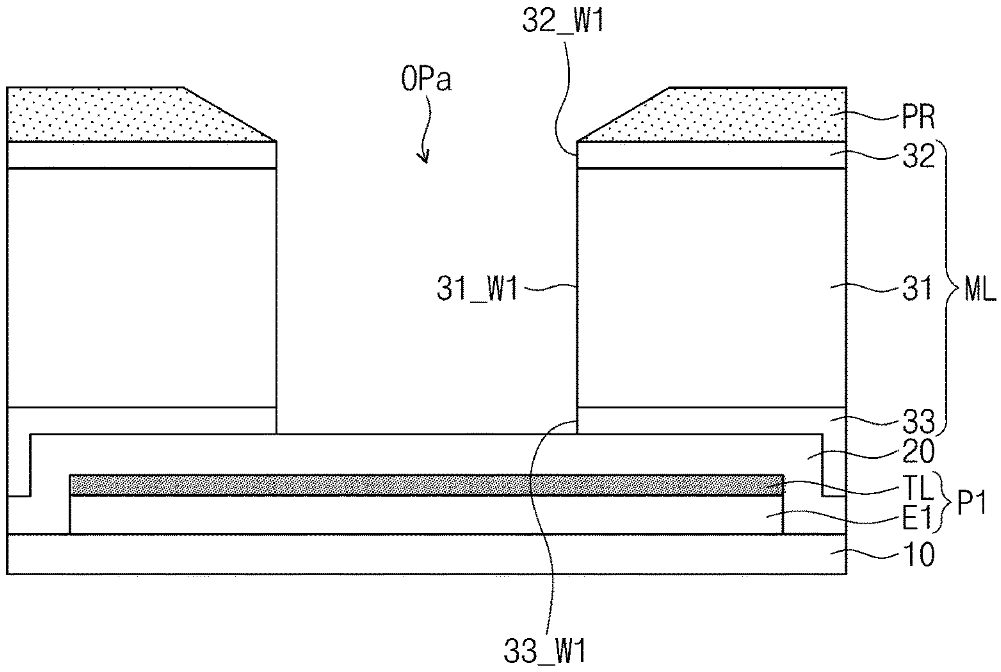

Thereafter, as illustrated in FIG. 5E, a first through-hole OPa may be formed by patterning the initial layer ML. The first through-hole OPa may be formed by a first etching process, and may be defined by side surfaces 31_W1, 32_W1, and 33_W1 of first to third layers 31, 32, and 33. The side surfaces 31_W1, 32_W1, and 33_W1 of the first to third layers 31, 32, and 33 may be aligned side by side along a thickness direction. The third layer 33 may be disposed between the first bank layer 20 and the first layer 31. The first etching process may be a dry etching, but is not limited thereto. The first etching process may be performed in an etching environment in which the etching selectivity between the first to third layers 31, 32, and 33 is substantially the same.

Figure 5F:
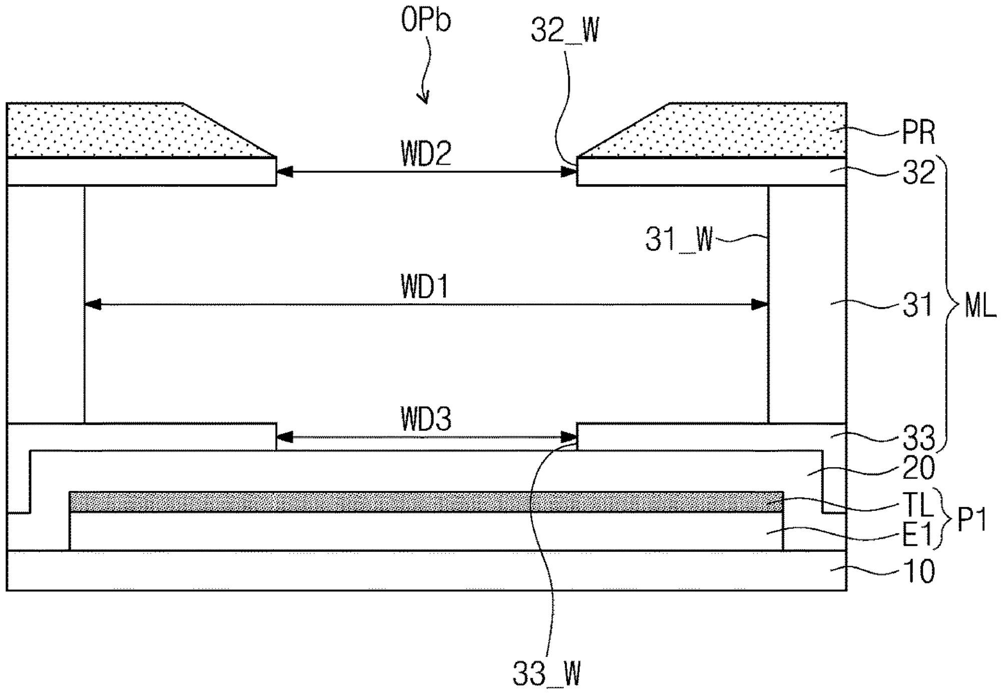

Thereafter, as illustrated in FIG. 5F, a second through-hole OPb may be formed by a second etching process. The second through-hole OPb may be defined by the side surfaces 31_W, 32_W, and 33_W of the first to third layers 31, 32, and 33. The second through-hole OPb may have an undercut shape on a cross-section.

The second etching process may be performed in an environment in which the etching selectivity between the first layer 31 and the other layers 32 and 33 is large. Accordingly, the side surfaces 31_W1, 32_W1, and 33_W1 of the first to third layers 31, 32, and 33 may be changed by the second etching process. For example, the side surface 31_W1 of the first layer 31 may be formed by being recessed more outward than the rest of the side surfaces 32_W and 33_W. Accordingly, a width WD1 of an opening formed in the first layer 31 may be greater than a width WD2 of an opening formed in the second layer 32, or a width WD3 of an opening formed in the third layer 33. The side surfaces 32_W and 33_W of the second and third layers may protrude from the side surface 31_W1 of the first layer toward the center of the second through-hole OPb.

Figure 5G:
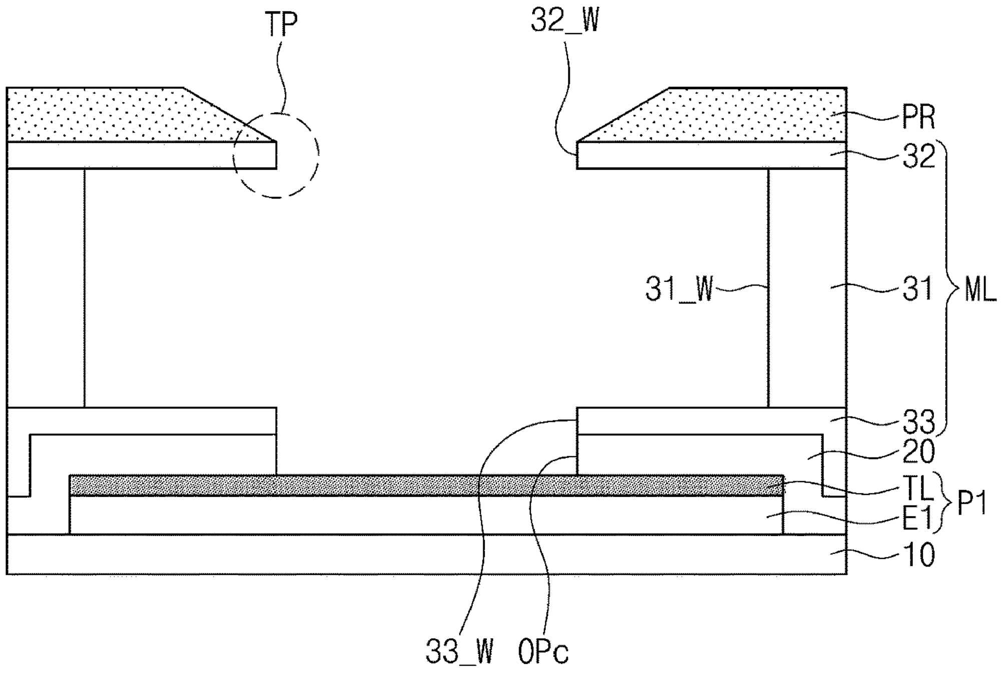

Thereafter, as illustrated in FIG. 5G, a third through-hole OPc may be formed in the first bank layer 20 by a third etching process. At this time, since the barrier layer TL is disposed on the first electrode E1, the first electrode E1 is not exposed by the third through-hole OPc. Accordingly, a damage to the first electrode E1 may be prevented during the third etching process.

Figure 5H:
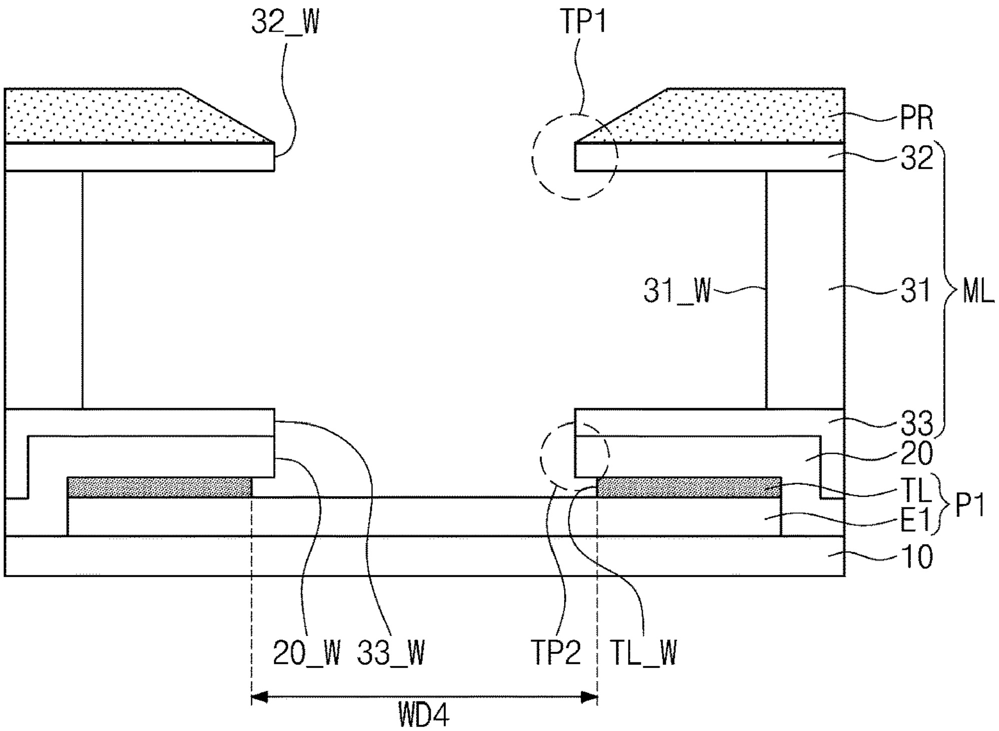

Thereafter, as illustrated in FIG. 5H, the barrier layer TL may be additionally patterned through a fourth etching process. The fourth etching process may be the same process as the third etching process, or a separate process from the third etching process, but an embodiment is not limited thereto.

In case that the barrier layer TL is etched, at least a part of the first electrode E1 may be exposed. Accordingly, an inner surface TL_W, which defines a hole exposing the first electrode E1, may be formed in the barrier layer TL. A width WD4 of the hole formed at the barrier layer defined by the inner surface TL_W is larger than those of the hole formed at the second layer 32 and the hole formed at the third layer 33. Therefore, the inner surface TL_W of the barrier layer TL may be defined by being recessed from the side surface 20_W of the first bank layer 20. Accordingly, the side surface 20_W of the first bank layer 20 may protrude from the inner surface TL_W of the barrier layer TL to define a tip part TP2. Accordingly, a tip part TP1 formed by the side surface 32_W of the second layer 32 and a tip part TP2 formed by the side surface 20_W of the first bank layer 20 may exist. This is illustrated as an example, and the side surface 20_W of the first bank layer 20 may be aligned with the inner surface TL_W of the barrier layer TL, and an embodiment is not limited thereto.

In a display panel according to an embodiment, the barrier layer TL may be all removed. At this time, a gap corresponding to the thickness of the barrier layer TL may be formed between the first bank layer 20 and the first electrode E1.

Figure 5I:
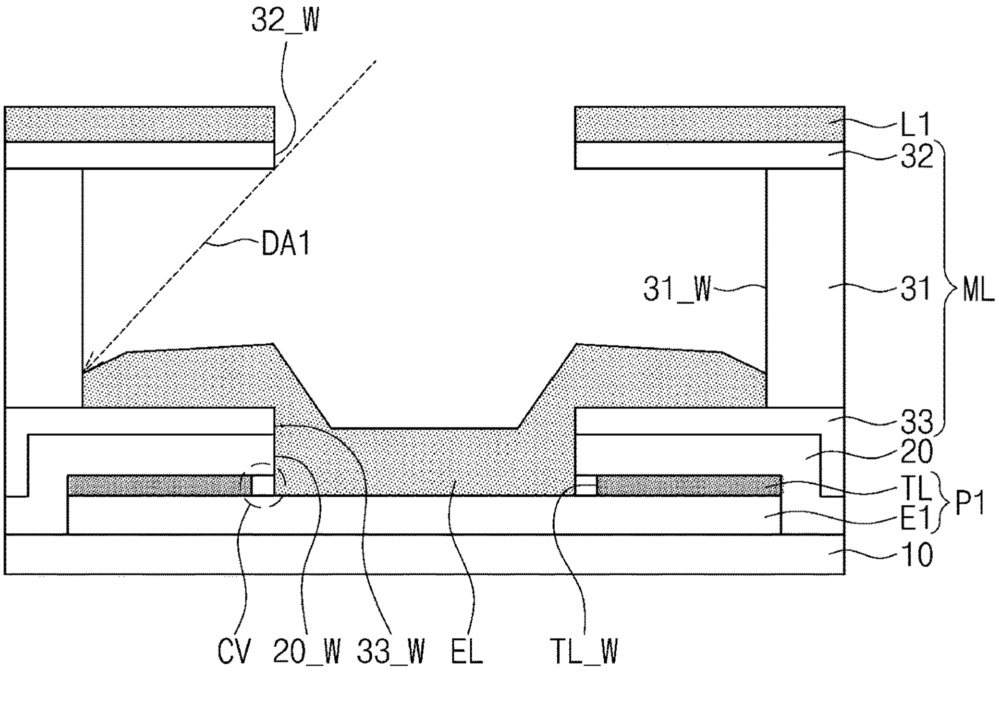

Thereafter, as illustrated in FIG. 5I, a first deposition layer L1 may be formed. At this time, an organic layer EL may be simultaneously formed. For convenience of description, FIG. 5I illustrates, as a dotted line, a deposition angle DA1 (hereinafter, a first deposition angle) at which the organic layer EL is formed. In an embodiment, since the first deposition layer L1 is deposited on the second layer 32 at the first deposition angle DA1, the organic layer EL may be in contact with a part of the side surface 31_W1 of the first layer 31. In case that the organic layer EL is formed with the first deposition angle DA1, the organic layer EL is blocked from the side surface 32_W of the second layer 32, and thus the organic layer EL may be formed separated from the first deposition layer L1. In a display panel according to an embodiment, a gap CV may be formed between the organic layer EL and the barrier layer BL. The gap CV may be a cavity.

Figure 5J:
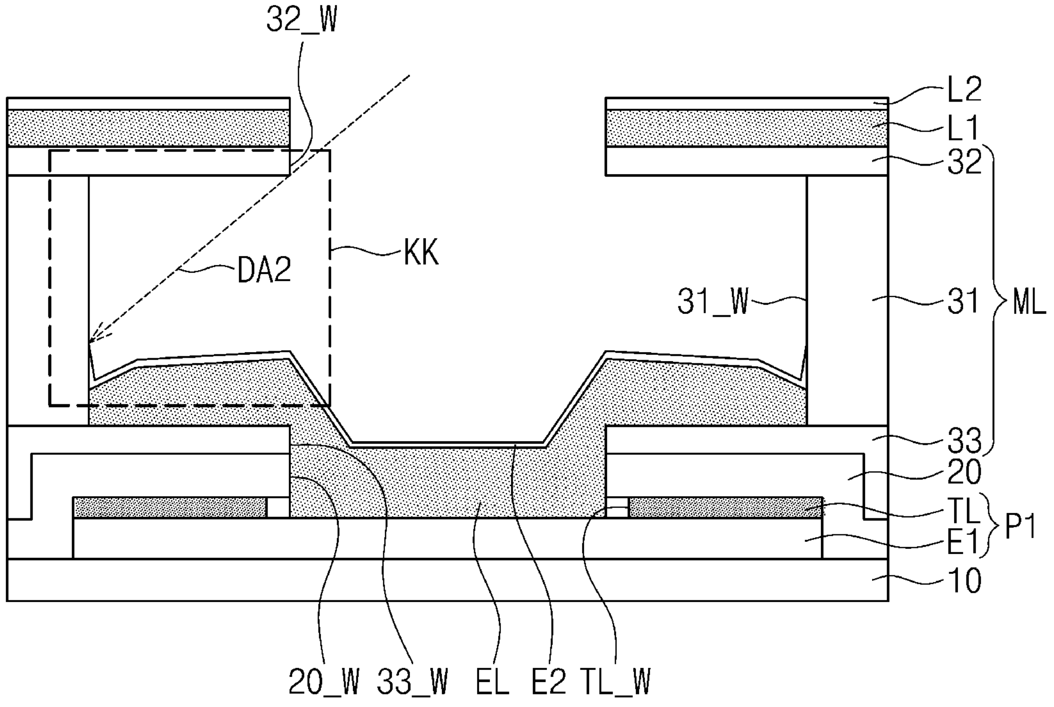

Thereafter, as illustrated in FIG. 5J, a second deposition layer L2 may be formed. At this time, a second electrode E2 may be simultaneously formed. The second electrode E2 may correspond to a cathode. For convenience of description, FIG. 5J illustrates, as a dotted line, a deposition angle DA2 (hereinafter, a second deposition angle) at which the second electrode E2 is formed. In case that the second electrode E2 is formed at the second deposition angle DA2, the second electrode E2 is blocked from the side surface 32_W of the second layer 32, and thus the second electrode E2 may be formed separated from the second deposition layer L2.

In an embodiment, since the second deposition layer L2 is deposited at the second deposition angle DA2, the second electrode E2 may be in contact with the side surface 31_W1 of the first layer 31. At this time, the second deposition angle DA2 may be relatively larger than the first deposition angle DAL For example, an angle formed between the second deposition angle DA2 and the side surface 32_W of the second layer may be larger than an angle formed between the first deposition angle DA1 and the side surface 32_W of the second layer.

A region KK in FIG. 5J is described in FIG. 6 describes corresponding to a. Referring with FIG. 6 together, it may be seen that the second electrode E2 is in contact with the side surface 31_W1 of the first layer 31, while having a relatively greater contact area therebetween than the contact area between the organic layer EL and the side surface 31_W1. A length LH and a thickness LD, on a cross-section, of a part in which the second electrode E2 and the side surface 31_W1 of the first layer 31 are in contact with each other are illustrated. According to the disclosure, since the second electrode E2 is formed with the second deposition angle DA2, the length LH may be equal to or greater than about 2000 Å, and the thickness LD may be equal to or greater than about 30 Å. Accordingly, the second electrode E2 and the first layer 31 may be stably electrically connected.

Figure 7A:
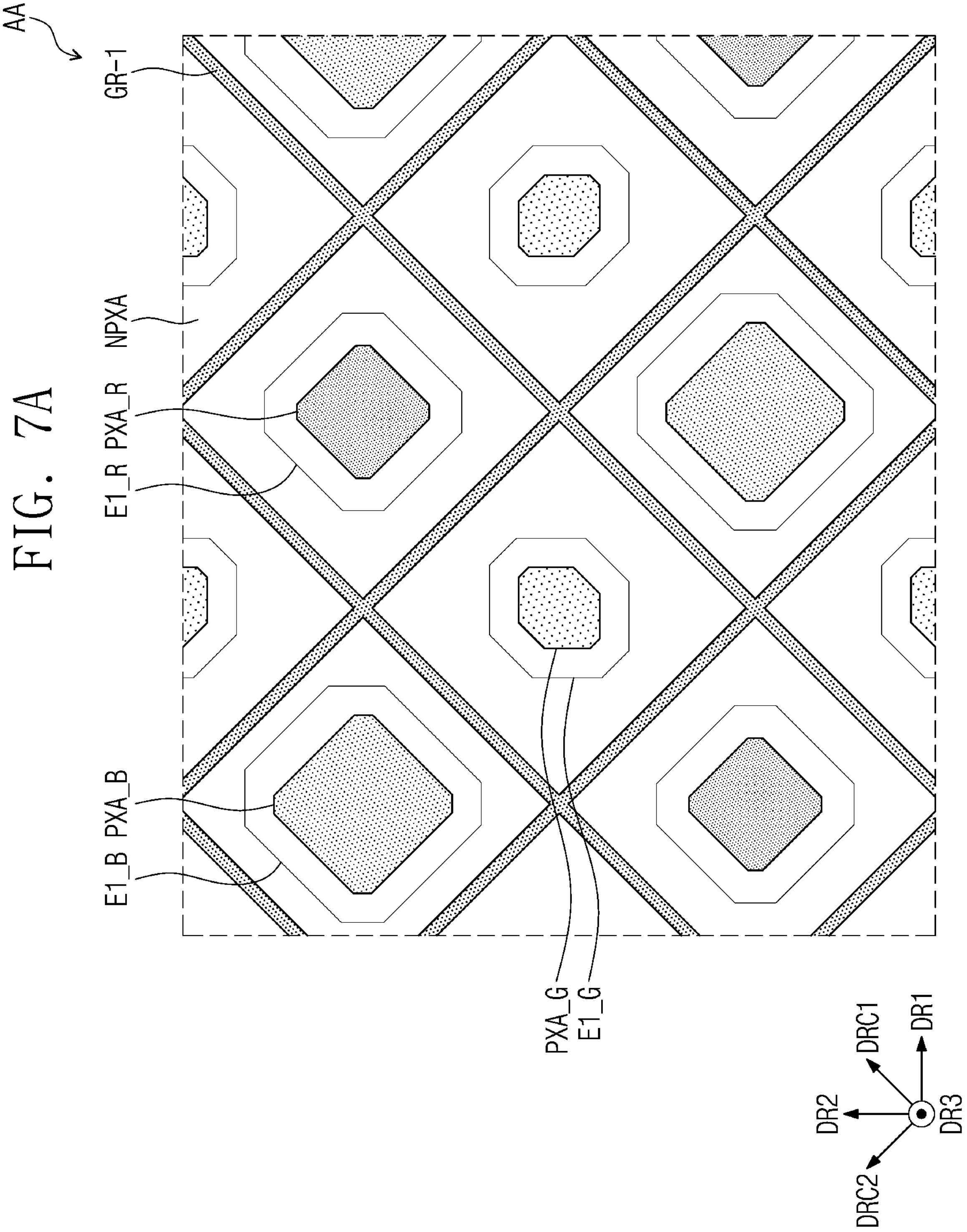
FIGS. 7A to 7C are schematic plan views illustrating a part of a display panel according to an embodiment.
Figure 7B:
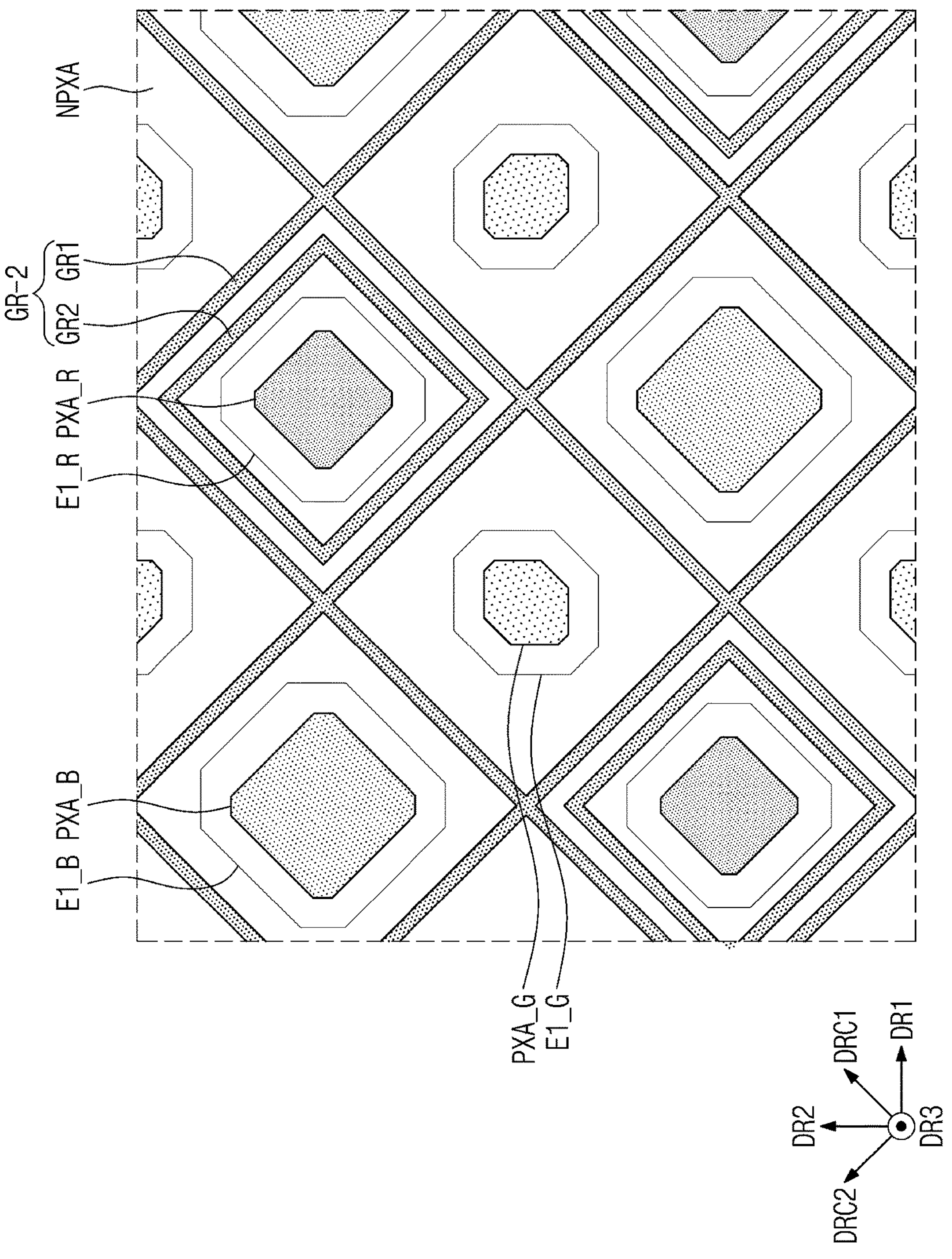
Figure 7C:
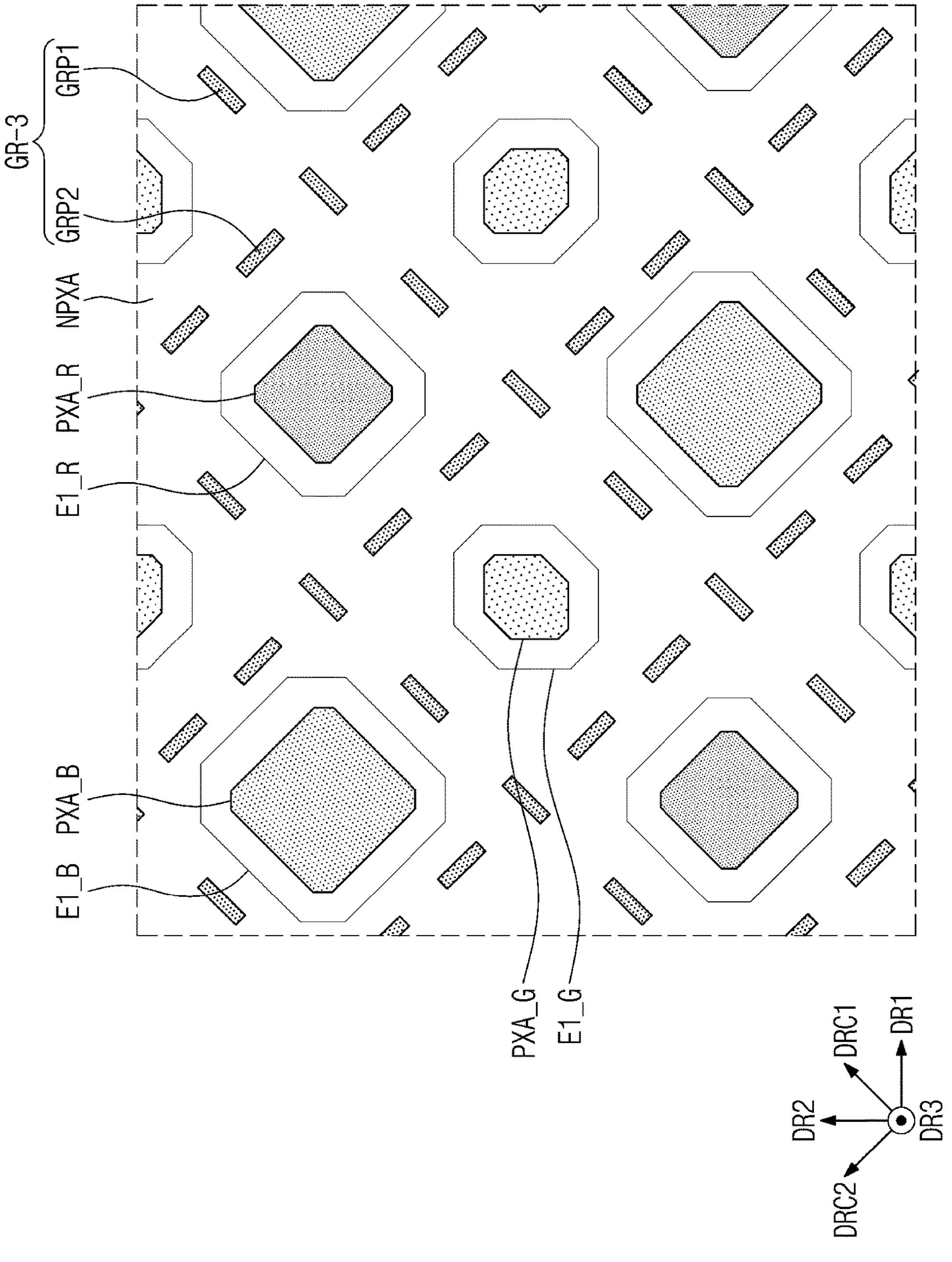

FIGS. 7A to 7C are schematic plan views illustrating a part of a display panel according to an embodiment. FIGS. 7A to 7C illustrate a region corresponding to FIG. 3A. Hereinafter, the disclosure will be described with reference to FIGS. 7A to 7C. The same reference numerals or symbols are used for the same components as those described in FIGS. 1 to 6, and duplicate descriptions therefor will be omitted.

As illustrated in FIG. 7A, grooves GR may have a mesh shape on a plane. At this time, the grooves GR may be formed to be independently separated from each other in each of the first to third light-emitting region PXA_R, PXA_G, and PXA_B. Although not illustrated, at this time, the grooves GR may be formed, on a cross-section, as a recess not completely penetrating a second bank layer (not shown). Accordingly, although grooves GR-1 each have a closed line shape surrounding each of the light-emitting regions PXA_R, PXA_G, and PXA_B, a common voltage may be stably provided through the second bank layer.

By way of example, as illustrated in FIG. 7B, a groove GR-2 may include a first groove GR1 and a second groove GR2. The first groove GR1 may correspond to the groove GR-1 illustrated in FIG. 7A, and the second grooves GR2 may be additionally formed adjacent to a light-emitting region PXA_R among the light-emitting regions PXA_R, PXA_G, and PXA_B.

By way of example, as illustrated in FIG. 7C, a groove GR-3 may also include patterns GRP1 and GRP2. The patterns GRP1 and GRP2 may include first groove patterns GRP1 arranged or disposed along a first diagonal direction DRC1, and second groove patterns GRP2 arranged or disposed along a second diagonal direction DRC2. Since the groove GR-3 is formed to have the of patterns GRP1 and GRP2, the display panel according to the disclosure may be applied to even a panel having the light-emitting regions PXA_R, PXA_G, and PXA_B having various sizes and arrays thereof, thereby improving a degree of freedom in designing.

Figure 8A:
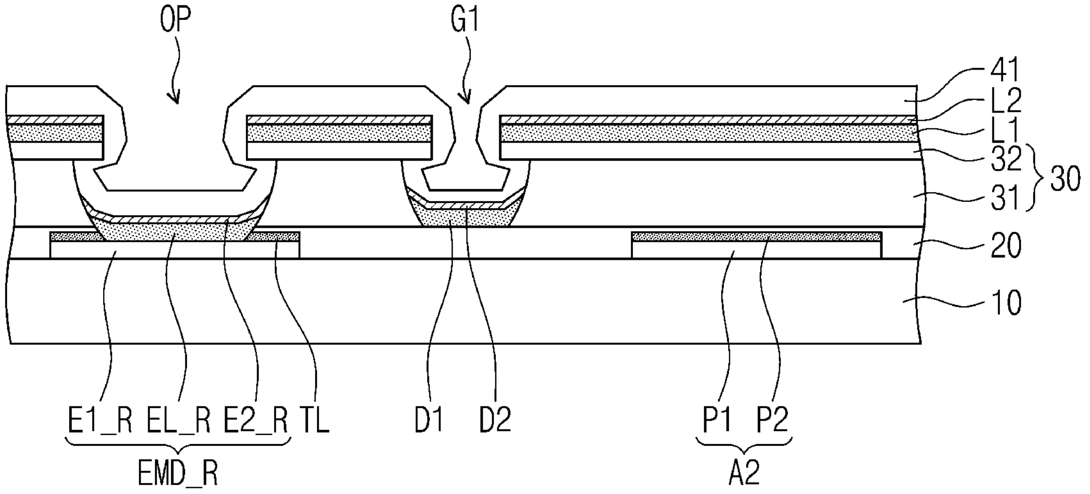
FIGS. 8A to 8C are schematic cross-sectional views illustrating a display panel manufacturing method according to an embodiment.
Figure 8B:
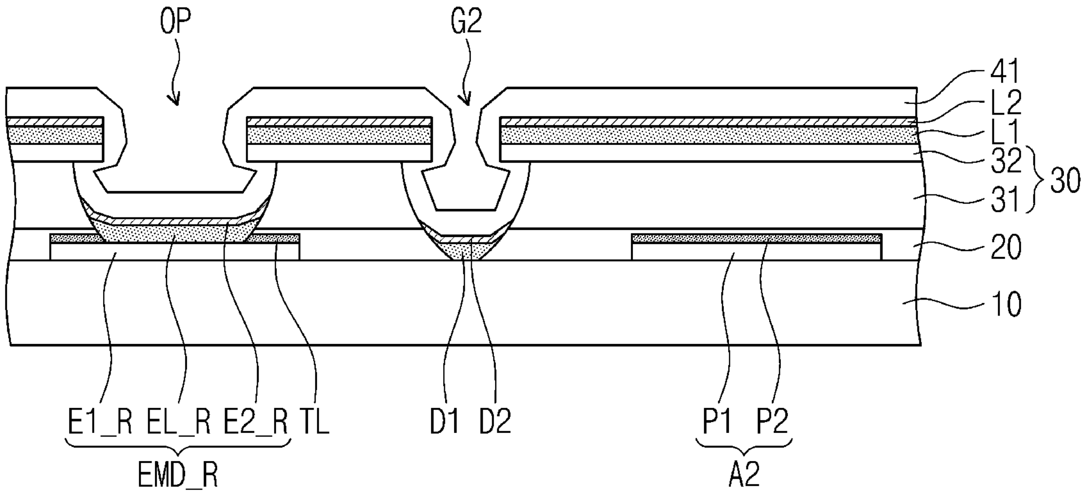
Figure 8C:
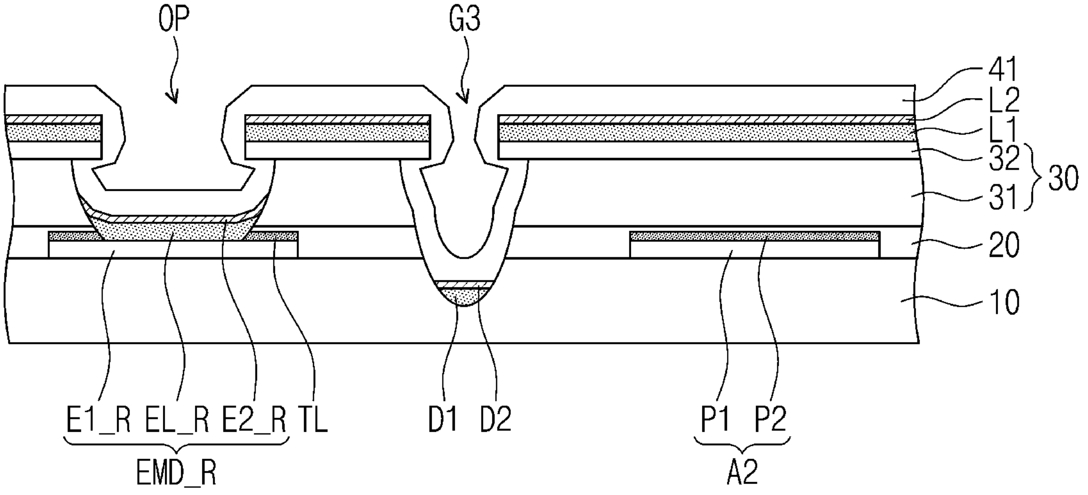

FIGS. 8A to 8C are schematic cross-sectional views illustrating a display panel manufacturing method according to an embodiment. FIGS. 8A to 8C each illustrate an operation corresponding to FIG. 4G, and respectively illustrate embodiments distinguished from each other. Hereinafter, the disclosure will be described with reference to FIGS. 8A to 8C. The same reference numerals or symbols are used for the same components as those described in FIGS. 1 to 7C, and duplicate descriptions therefor will be omitted.

As illustrated in FIG. 8A, a groove G1 may be formed penetrating the second bank layer 30, and may not be formed in the first bank layer 20. Accordingly, a depth of a pixel opening OP and a depth of the groove G1 may be different from each other.

By way of example, as illustrated in FIG. 8B, a groove G2 may be formed in a recessed form without penetrating the second bank layer 30. For example, since the groove G2 penetrates the second layer 32, but is formed as a recess in the first layer 31, a part of the first layer 31 may remain. Accordingly, an electrical connection through the first layer 31 may be readily established even in a position in which the groove G2 is formed.

By way of example, as illustrated in FIG. 8C, a groove G3 may be formed to extend up to a part of the intermediate layer 10. The groove G3 may penetrate the first bank layer 20 and the second bank layer 30, and may be formed as a recess in the intermediate layer 10. At this time, a depth of the groove G3 may be greater than a depth of the opening OP.

According to the disclosure, the grooves G1, G2, and G3 and the pixel opening OP may be simultaneously formed, but depths thereof may be variously controlled according to an etching environment. Accordingly, the shapes of the grooves G1, G2, and G3 may not be limited to any one, and thus a degree of freedom in designing may be improved.

According to the disclosure, a light-emitting layer may be patterned without a metal mask, thereby improving process reliability. A high-resolution display panel may be provided.

According to the disclosure, leakage current, driving error, or the like between light-emitting regions adjacent to each other may be alleviated.

In the above, description has been made with reference to embodiments, but those skilled in the art or those of ordinary skill in the relevant technical field may understand that various modifications and changes may be made the disclosure not departing from the spirit and the technology scope of the disclosure described in the claims to be described later. Therefore, the technical scope of the disclosure is not limited to the contents described in the detailed description of the specification, but should be determined also by the claims.

What is claimed is:

1. A display panel comprising:

an insulating layer;

a bank layer disposed on the insulating layer, and including a first pixel opening, a second pixel opening, and a groove between the first pixel opening and the second pixel opening;

a first light-emitting element disposed in the first pixel opening, and including a first anode, a first organic layer, and a first cathode, the first cathode contacting the bank layer;

a second light-emitting element disposed in the second pixel opening, and including a second anode, a second organic layer, and a second cathode, the second cathode spaced apart from the first cathode and contacting the bank layer; and a barrier layer disposed between the bank layer and the first anode, and exposing at least a part of the first anode, wherein the first anode is spaced apart from the bank layer with the barrier layer disposed between the first anode and the bank layer on a cross-section, wherein the groove exposes the insulating layer.

2. The display panel of claim 1, wherein the barrier layer comprises a transparent conductive oxide.

3. The display panel of claim 1, wherein a first surface of the bank layer defining the first pixel opening protrudes from an inner surface of the barrier layer exposing the first anode, to define a tip part.

4. The display panel of claim 1, wherein the bank layer comprises:

a first bank layer including an inorganic material, and contacting the barrier layer; and a second bank layer disposed on the first bank layer, and including a conductive material, wherein the second cathode contacts the second bank layer.

5. The display panel of claim 4, wherein the first pixel opening and the second pixel opening each have a substantially undercut shape on a cross-section, and the second bank layer has side surfaces defining the substantially undercut shape.

6. The display panel of claim 5, wherein the second bank layer comprises:

a first layer having a conductive material and having a first inner surface defining the first pixel opening; and a second layer disposed on the first layer and having a second inner surface defining the first pixel opening, wherein the second inner surface protrudes from the first inner surface.

7. The display panel of claim 6, wherein the second bank layer further comprises a third layer disposed between the second layer and the first bank layer, and having a third inner surface protruding from the first inner surface to define the first pixel opening.

8. The display panel of claim 6, wherein a height of a part in which the first cathode and the first inner surface are in contact is about equal to or greater than about 2000 Å on a cross-section.

9. The display panel of claim 6, wherein a thickness of a part in which the first cathode and the first inner surface are in contact is about equal to or greater than about 30 Å.

10. The display panel of claim 4, wherein the groove penetrates the second bank layer.

11. The display panel of claim 10, wherein the groove has a depth greater than a thickness of the bank layer.

12. The display panel of claim 4, wherein the groove is recessed from an upper surface of the second bank layer, and a depth of the groove is less than a thickness of the second bank layer.

13. The display panel of claim 1, further comprising:

an inorganic film covering the first light-emitting element and the second light-emitting element, and having a substantially integrated shape.

14. The display panel of claim 13, further comprising:

at least one deposition layer disposed on the bank layer, wherein the first organic layer and the second organic layer, and the first cathode and the second cathode are separated from the deposition layer, and the deposition layer is covered by the inorganic film.

15. A display panel comprising:

a bank layer including a first pixel opening, a second pixel opening, and a groove disposed between the first pixel opening and the second pixel opening and extending into the bank layer;

a first light-emitting element disposed in the first pixel opening, and including a first anode, a first organic layer, and a first cathode;

a second light-emitting element disposed in the second pixel opening, and including a second anode, a second organic layer, and a second cathode; and a dummy layer disposed in the groove, having a same material as the first organic layer or the first cathode, and separated from the first organic layer and the first cathode, wherein the first cathode and the second cathode are spaced apart from each other, and contact the bank layer, and wherein the first anode, the second anode, and the dummy layer are disposed on the same layer.

16. The display panel of claim 15, wherein the groove has a substantially mesh shape in a plan view.

17. The display panel of claim 16, wherein a depth of the groove is less than a thickness of the bank layer.

18. The display panel of claim 15, wherein the groove comprises groove patterns separated from each other in a plan view.

19. The display panel of claim 18, wherein a depth of the groove is about equal to or greater than a thickness of the bank layer.

* * * * *